United States Patent
Ockenfuss

(10) Patent No.: US 9,923,007 B2
(45) Date of Patent: Mar. 20, 2018

(54) METAL MIRROR BASED MULTISPECTRAL FILTER ARRAY

(71) Applicant: Viavi Solutions Inc., Milpitas, CA (US)

(72) Inventor: Georg J. Ockenfuss, Santa Rosa, CA (US)

(73) Assignee: VIAVI Solutions Inc., San Jose, CA (US)

(*) Notice: Subject to any disclaimer, the term of this patent is extended or adjusted under 35 U.S.C. 154(b) by 0 days.

(21) Appl. No.: 15/385,240

(22) Filed: Dec. 20, 2016

(65) Prior Publication Data
US 2017/0186793 A1    Jun. 29, 2017

Related U.S. Application Data

(60) Provisional application No. 62/272,086, filed on Dec. 29, 2015, provisional application No. 62/294,970, filed on Feb. 12, 2016.

(51) Int. Cl.
*H01L 31/00* (2006.01)
*H01L 27/146* (2006.01)
(Continued)

(52) U.S. Cl.
CPC ...... *H01L 27/14621* (2013.01); *G01J 3/0208* (2013.01); *G01J 3/26* (2013.01);
(Continued)

(58) Field of Classification Search
CPC .. G01J 3/513; G01J 3/51; G01J 3/0208; G01J 2003/2826; G01J 2003/2806;
(Continued)

(56) References Cited

U.S. PATENT DOCUMENTS

| 3,442,572 A | 5/1969 | Illsley et al. |
| 3,530,824 A | 11/1970 | Illsley et al. |

(Continued)

FOREIGN PATENT DOCUMENTS

| JP | 62 267624 | 11/1987 |
| WO | 2008/012235 | 1/2008 |

(Continued)

OTHER PUBLICATIONS

Ferreira et al., "Narrow-band pass filter array for integrated optoelectronic spectroscopy detectors to assess esophageal tissue", Biomed Opt. Exp. 2, http://www.ncbi.nlm.nih.gov/pmc/articles/PMC3114235/, Jun. 1, 2011, 12 pages.

(Continued)

Primary Examiner — Ngan Ngo
(74) Attorney, Agent, or Firm — Harrity & Harrity, LLP

(57) ABSTRACT

A device may include a multispectral filter array disposed on the substrate. The multi spectral filter array may include a first metal mirror disposed on the substrate. The multi spectral filter may include a spacer disposed on the first metal mirror. The spacer may include a set of layers. The spacer may include a second metal mirror disposed on the spacer. The second metal mirror may be aligned with two or more sensor elements of a set of sensor elements.

20 Claims, 21 Drawing Sheets

(51) Int. Cl.
*H01L 31/0216* (2014.01)
*G01J 3/51* (2006.01)
*G01J 3/02* (2006.01)
*G01J 3/26* (2006.01)
*G01J 3/28* (2006.01)
*G01J 3/36* (2006.01)
*G02B 5/28* (2006.01)

(52) U.S. Cl.
CPC ............. *G01J 3/2803* (2013.01); *G01J 3/36* (2013.01); *G01J 3/51* (2013.01); *G01J 3/513* (2013.01); *G02B 5/286* (2013.01); *G02B 5/288* (2013.01); *H01L 27/1462* (2013.01); *H01L 27/1464* (2013.01); *H01L 27/14627* (2013.01); *H01L 27/14629* (2013.01); *H01L 27/14643* (2013.01); *H01L 27/14685* (2013.01); *H01L 31/02162* (2013.01); *G01J 2003/2806* (2013.01); *G01J 2003/2826* (2013.01)

(58) Field of Classification Search
CPC ......... H01L 27/14621; H01L 27/14629; H01L 31/02162; H01L 27/14643
See application file for complete search history.

(56) References Cited

U.S. PATENT DOCUMENTS

| | | | |
|---|---|---|---|
| 3,617,331 A | 11/1971 | Illsley et al. | |
| 4,547,074 A | 10/1985 | Hinoda et al. | |
| 4,957,371 A | 9/1990 | Pellicori et al. | |
| 5,144,498 A | 9/1992 | Vincent | |
| 5,246,803 A * | 9/1993 | Hanrahan | H01L 31/02165 |
| | | | 136/257 |
| 5,337,191 A | 8/1994 | Austin | |
| 5,784,507 A | 6/1998 | Holm-Kennedy | |
| 5,872,655 A | 2/1999 | Seddon et al. | |
| 5,905,571 A * | 5/1999 | Butler | G01J 3/18 |
| | | | 356/326 |
| 5,986,808 A | 11/1999 | Wang | |
| 6,215,802 B1 | 4/2001 | Lunt | |
| 6,297,907 B1 | 10/2001 | Wang | |
| 6,465,105 B1 | 10/2002 | Johnson et al. | |
| 6,574,490 B2 | 6/2003 | Abbink et al. | |
| 6,611,636 B2 | 8/2003 | Deliwala | |
| 6,631,033 B1 | 10/2003 | Lewis et al. | |
| 6,638,668 B2 | 10/2003 | Buchsbaum et al. | |
| 6,850,366 B2 | 2/2005 | Hendrix et al. | |
| 6,891,685 B2 | 5/2005 | Deliwala et al. | |
| 6,912,330 B2 | 6/2005 | Deliwala et al. | |
| 7,002,697 B2 | 2/2006 | Domash et al. | |
| 7,006,292 B2 | 2/2006 | Hendrix et al. | |
| 7,133,197 B2 | 11/2006 | Ockenfuss et al. | |
| 7,378,346 B2 | 5/2008 | Le et al. | |
| 7,456,383 B2 | 11/2008 | Kim et al. | |
| 7,521,666 B2 | 4/2009 | Tsang | |
| 7,907,340 B2 | 3/2011 | Wang et al. | |
| 8,031,336 B2 | 10/2011 | Shibayama et al. | |
| 8,084,728 B2 | 12/2011 | Tsang | |
| 8,163,144 B2 | 4/2012 | Tilsch et al. | |
| 8,274,739 B2 | 9/2012 | Lee et al. | |
| 8,284,401 B2 | 10/2012 | Choi et al. | |
| 8,411,269 B2 | 4/2013 | Shibayama et al. | |
| 8,480,865 B2 | 7/2013 | Ockenfuss et al. | |
| 8,542,359 B2 | 9/2013 | Choi et al. | |
| 8,879,152 B2 | 11/2014 | Junger et al. | |
| 8,896,839 B2 | 11/2014 | Saptari | |
| 9,291,504 B2 | 3/2016 | Goldring et al. | |
| 9,304,039 B2 | 4/2016 | Tack et al. | |
| 9,366,573 B2 | 6/2016 | Geelen et al. | |
| 9,383,258 B2 | 7/2016 | Goldring et al. | |
| 2003/0040175 A1 | 2/2003 | Deliwala | |
| 2003/0087121 A1 | 5/2003 | Domash et al. | |
| 2007/0247716 A1 | 10/2007 | Kim et al. | |
| 2012/0085944 A1 | 4/2012 | Gidon et al. | |
| 2012/0129269 A1 | 5/2012 | Choi et al. | |
| 2012/0327248 A1 | 12/2012 | Tack et al. | |
| 2013/0107246 A1 | 5/2013 | Yang | |
| 2014/0014838 A1 | 1/2014 | Hendrix et al. | |
| 2014/0168761 A1 | 6/2014 | Ockenfuss et al. | |
| 2014/0175265 A1 | 6/2014 | Gonzalez et al. | |
| 2014/0267849 A1 | 10/2014 | Geelen et al. | |
| 2014/0267878 A1 | 10/2014 | Geelen et al. | |
| 2014/0295610 A1 | 10/2014 | Nakamura et al. | |
| 2014/0313342 A1 * | 10/2014 | Gan | B82Y 20/00 |
| | | | 348/162 |
| 2014/0320611 A1 | 10/2014 | Choi | |
| 2015/0036138 A1 | 2/2015 | Watson et al. | |
| 2015/0103354 A1 | 4/2015 | Saptari | |
| 2015/0138640 A1 | 5/2015 | Matsushita | |
| 2015/0144770 A1 | 5/2015 | Choi | |
| 2015/0214261 A1 * | 7/2015 | Park | G02B 5/287 |
| | | | 257/432 |
| 2015/0233762 A1 | 8/2015 | Goldring et al. | |
| 2015/0276478 A1 | 10/2015 | Geelen et al. | |
| 2015/0300879 A1 | 10/2015 | Goldring et al. | |
| 2015/0369980 A1 | 12/2015 | Ockenfuss et al. | |
| 2016/0120410 A1 | 5/2016 | Kim | |
| 2016/0123808 A1 | 5/2016 | Obermueller | |
| 2016/0238759 A1 | 8/2016 | Sprague et al. | |

FOREIGN PATENT DOCUMENTS

| | | |
|---|---|---|
| WO | WO 2011/064403 | 6/2011 |
| WO | WO 2013/064507 | 5/2013 |
| WO | WO 2013/064510 | 5/2013 |
| WO | WO 2013/064511 | 5/2013 |
| WO | WO 2013/065035 | 5/2013 |
| WO | WO 2015/195123 | 12/2015 |

OTHER PUBLICATIONS

Graaf et al., "On-Chip Integrated Optical Microspectrometer with Light-to-Frequency Converter and Bus Interface", IEEE International Solid-State Circuits Conference, http://citeseerx.ist.psu.edu/viewdoc/download?doi=10.1.1.29.4891&rep=rep1&type=pdf, 1999, 2 pages.

Minas et al., "An array of Fabry-Perot optical channels for biological fluids analysis", Sensors & Actuators, http://dei-s1.dei.uminho.pt/pessoas/higino/pampus/GM_SA_2004.pdf, Jun. 19, 2004, 6 pages.

Bogaerts et al., "High-end CMOS Active Pixel Sensor for Hyperspectral Imaging", Proceedings of IEEE Int. Workshop on CCD and Advanced Image Sensors, http://www.imagesensors.org/Past%20Workshops/2005%20Workshop/2005%20Papers/11%20Bogaerts%20et%20al.pdf, Jun. 9, 2005, 5 pages.

Frey et al., "Multispectral interference filter arrays with compensation of angular dependence or extended spectral range", 2015, 19 pages.

Girard-Desprolet, "Plasmon-based spectral filtering with metallic nanostructures for CMOS image sensors", PhD thesis, Univ. Grenoble Alpes, 2015, 225 pages.

McGrindle, "Structured photonic materials for multi-spectral imaging applications", PhD thesis, Univ. of Glasgow, http://theses.gla.ac.uk/6446/, Mar. 2015, 215 pages.

Atwater, "Plasmonic Structures for CMOS Photonics and control of spontaneous Emission", AFRL report, http://www.dtic.mil/dtic/tr/fulltext/u2/a578545.pdf, Apr. 2013, 16 pages.

Xu et al., "Plasmonic nanoresonators for high-resolution color filtering and spectral imaging", Nature Comm., http://www.nature.com/ncomms/journal/v1/n5/full/ncomms1058.html, Aug. 24, 2010, 5 pages.

Wang et al., "Ultra-high-sensitivity color imaging via a transparent diffractive-filter array and computational optics", Optica 2 (11), https://www.osapublishing.org/optica/abstract.cfm?uri=optica-2-11-933, Oct. 29, 2015, 9 pages.

Fluckiger, "GSolver: Diffraction Grating Analysis for Windows", software for calculating performance of gratings, http://www.gsolver.com/http://www.gsolver.com/UserManual.pdf, Apr. 26, 2006, 131 pages.

(56) References Cited

OTHER PUBLICATIONS

Della Patria et al., "Visible-Infrared Imaging by a portable spectrometer with linear variable filters", 3rd annual hyperspectral imaging conference, Rome, https://www.academia.edu/4591078/Conference_Chair_Visible-Infrared_Imaging_by_a_Portable_Spectrometer_with_Linearly_Variable_Filters, May 15, 2012, 7 pages.

Hintschich et al., "MEMS-based miniature near-infrared spectrometer for application in environmental and food monitoring", Proceedings of 8th Inter. Conf. on Sensing Tech., Liverpool, http://s2is.org/ICST-2014/papers/1569977743.pdf, Sep. 2, 2014, 5 pages.

Gibbons, "Hyperspectral Imaging; What is is? How does it work?", Photonics Tech Briefs, http://www.techbriefs.com/component/content/article/ntb/features/application-briefs/19507, Mar. 1, 2014, 2 pages.

Ross, "Iris Recognition: the path forward", IEEE Computer Society, http://www.cse.msu.edu/~rossarun/pubs/RossIrisPathForward_IEEECOMP2010.pdf, Feb. 2010, 7 pages.

Ma et al., "CMOS-compatible integrated spectrometer based on Echelle Diffraction Grating and MSM photodetector array", IEEE Photonics Journal 5(2), http://ieeexplore.ieee.org/stamp/stamp.jsp?tp=&arnumber=6472720, Apr. 15, 2013, 8 pages.

Vagni, "Survey of hyperspectral and multispectral imaging technologies", RTO / NATO technical report, www.dtic.mil/cgi-bin/GetTRDoc?AD=ADA473675, May 2007, 44 pages.

Aubury et al., "Binomial Filters", Journal of VLSI Signal Processing, I, 1-8, http://www.doc.ic.ac.uk/~wl/papers/bf95.pdf, Jul. 24, 1995, 27 pages.

Lumidigm, "V-Series Fingerprint Sensors", http://www.hidglobal.com/products/biometrics/lumidigm/lumidigm-v-series-fingerprint-sensors, Aug. 18, 2015, 5 pages.

Fraunhofer IPMS, "Miniaturized MEMS Grating Spectrometer", http://www.ipms.fraunhofer.de/content/dam/ipms/common/products/SAS/mini-spektrometer-e.pdf, Oct. 13, 2012, 2 pages.

Lapray et al., "Multispectral Filter Arrays: Recent Advances and Practical Implementation", http://www.mdpi.com/1424-8220/14/11/21626/htm, Nov. 17, 2014, 34 pages.

Gonzalez et al., "A CMOS-compatible, monolithically integrated snapshot-mosaic multispectral imager", NIR news 26 (4), Jun. 2015, 4 pages.

De Munck et al., "High performance hybrid and monolithic backside thinned CMOS imagers realized using a new integration process", Electr. Devices Meeting IEDM, 2006, 4 pages.

Walls et al., "Fabry-Perot Resonator with nanostructures for multispectral visible filtering", , 2th IEEE Int. Conf. on Nanotechn. (IEEE-NANO), Aug. 20, 2012, 5 pages.

Choi, "apollo: nano spectrometer on-a-chip", presentation at TSensors, NanoLambda, http://www.memsindustrygroup.org/general/custom.asp?page=TSensors2013rsc, Oct. 23, 2013, 100 pages.

Haibach et al., "Precision in multivariate optical computing", Applied Optics 43 (10), Apr. 1, 2014, 11 pages.

Rowe et al., "Multispectral Fingerprint Biometrics", Proceed. 2005 IEEE Workshop on Information Assurance and Security, http://ieeexplore.ieee.org/xpl/login.jsp?tp=&arnumber=1495928&url=http%3A%2F%2Fieeexplore.ieee.org%2Fxpls%2Fabs_all.jsp%3Farnumber%3D1495928, 2005, 7 pages.

Williamson et al., "The Multivariate Optical Element Platform", CIRTEMO, LLC, 2013, 14 pages.

Consumer Physics, "Investor Presentation", Feb. 2015, 46 pages.

Stewart et al., "Multispectral Thin Film Biosensing and Quantitative Imaging Using 3D Plasmonic Crystals", ac research, Analytical Chemistry, vol. 81, No. 15, Aug. 1, 2009, 10 pages.

Jung et al., "Control of resonant wavelength from organic light-emitting materials by use of a Fabry-Perot microcavity structure," Jun. 1, 2002, 8 pages.

Extended European Search Report corresponding to EP 16207162.5, dated May 24, 2017, 12 pages.

\* cited by examiner

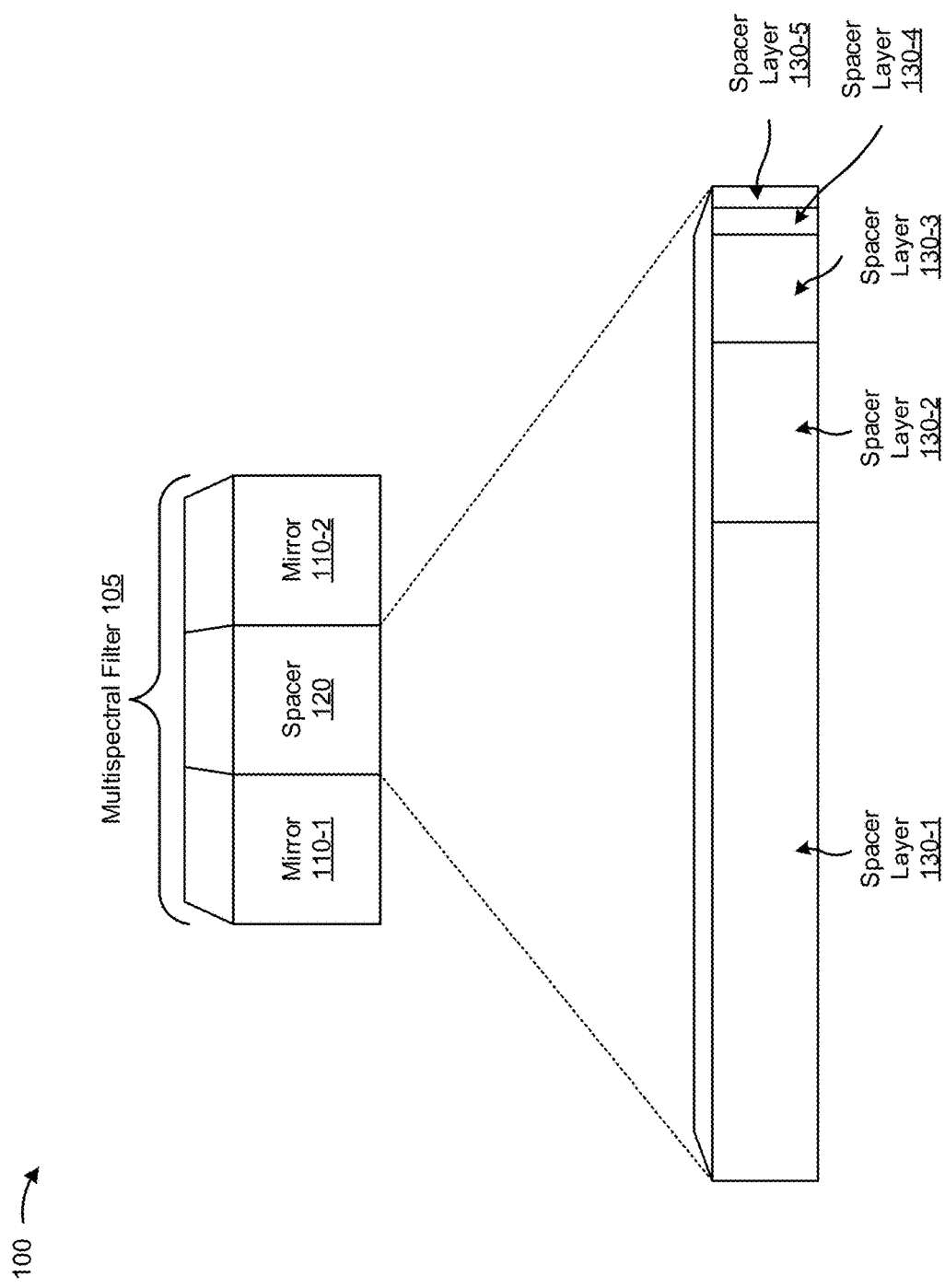

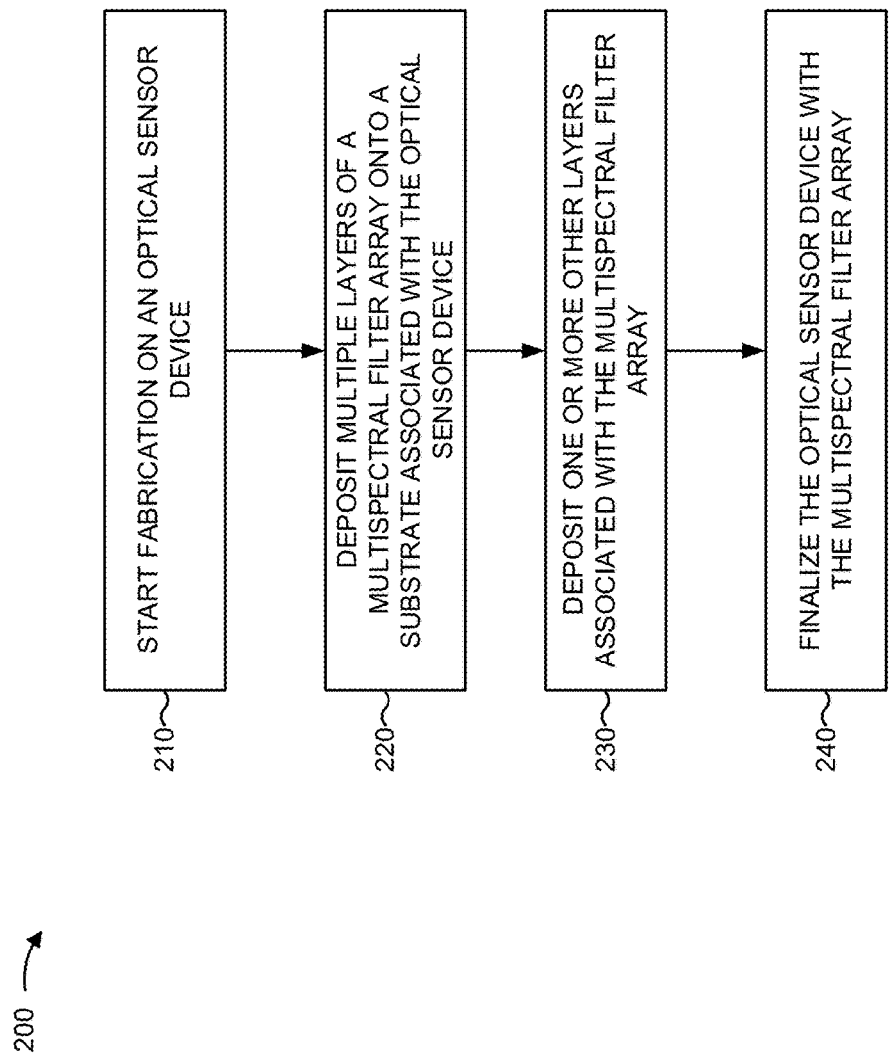

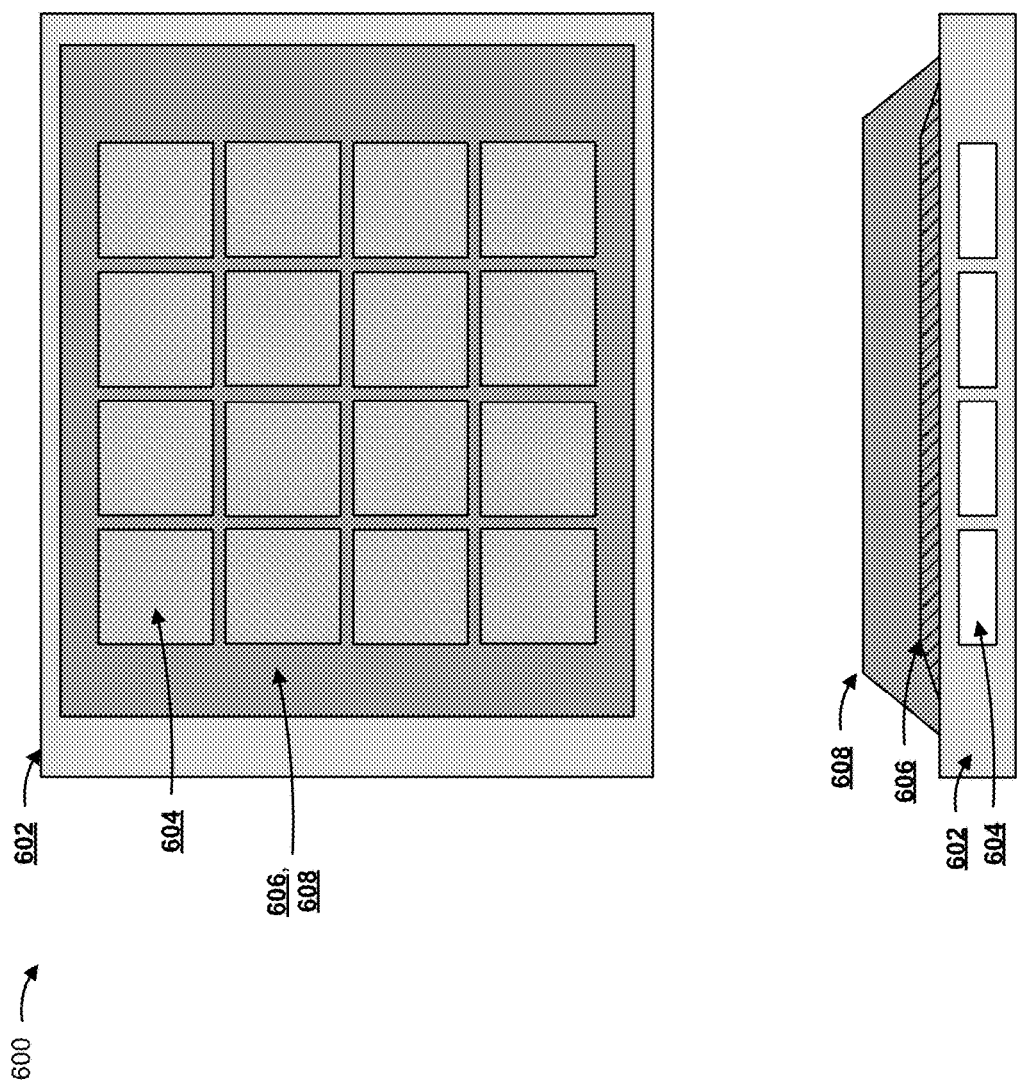

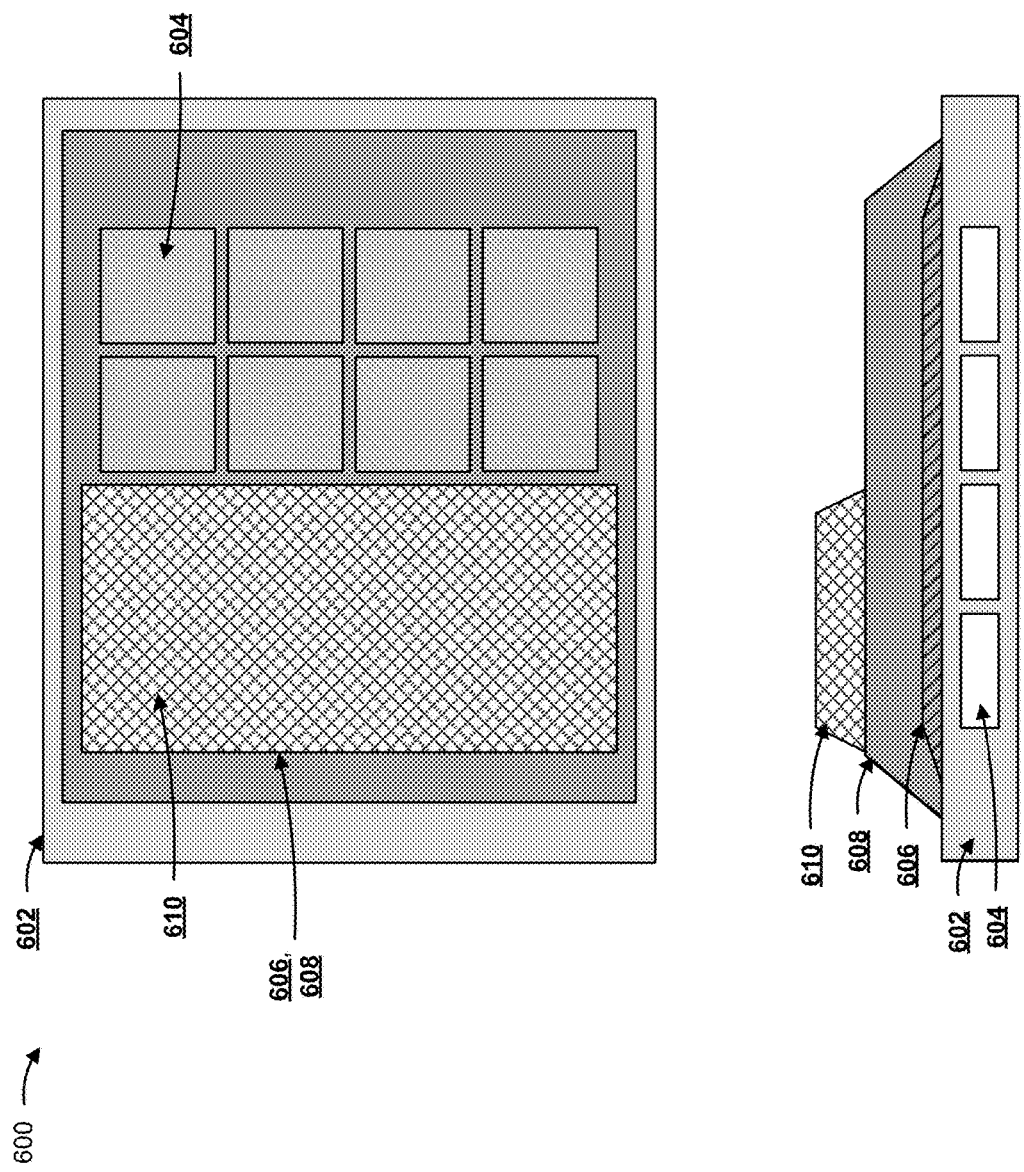

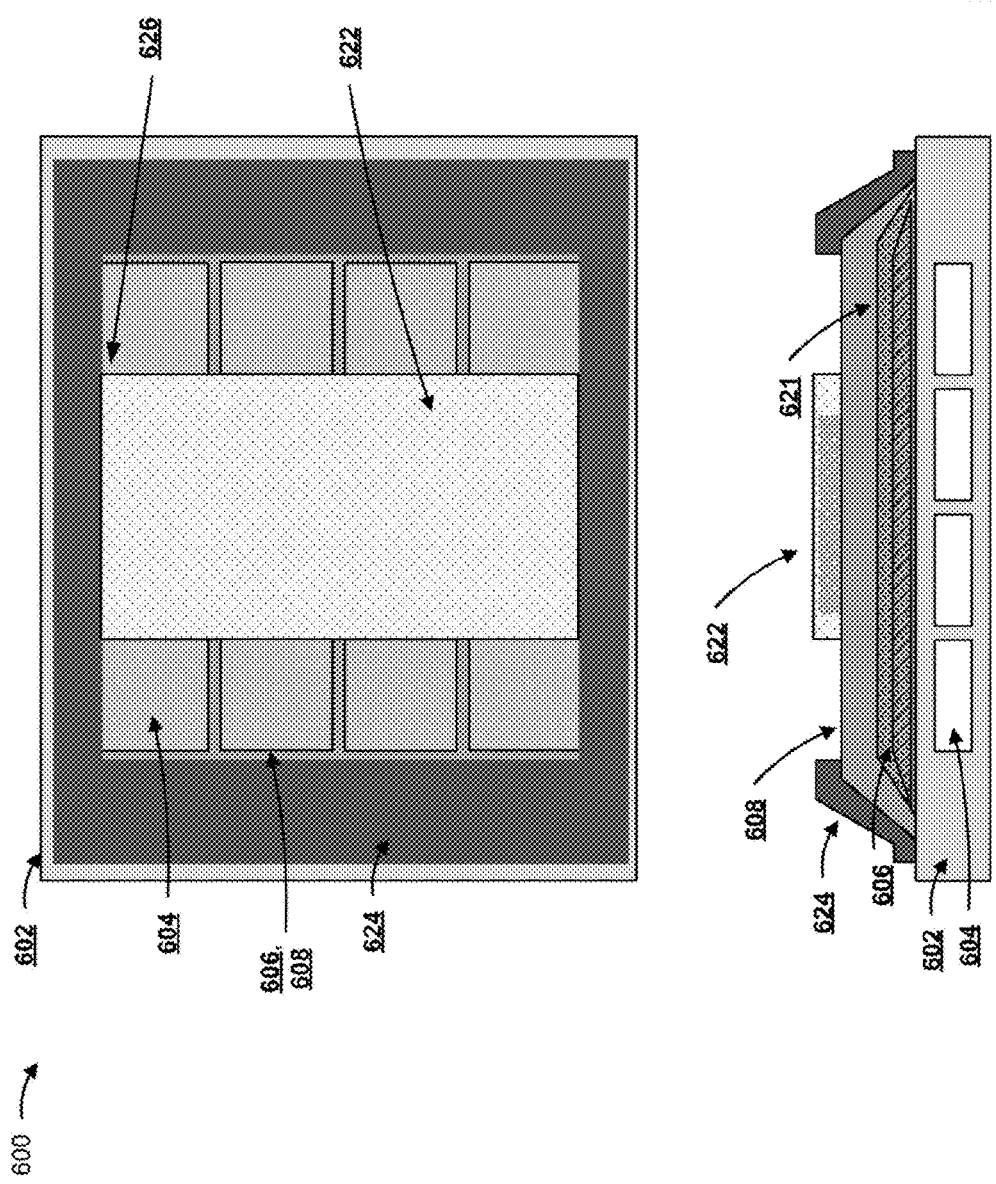

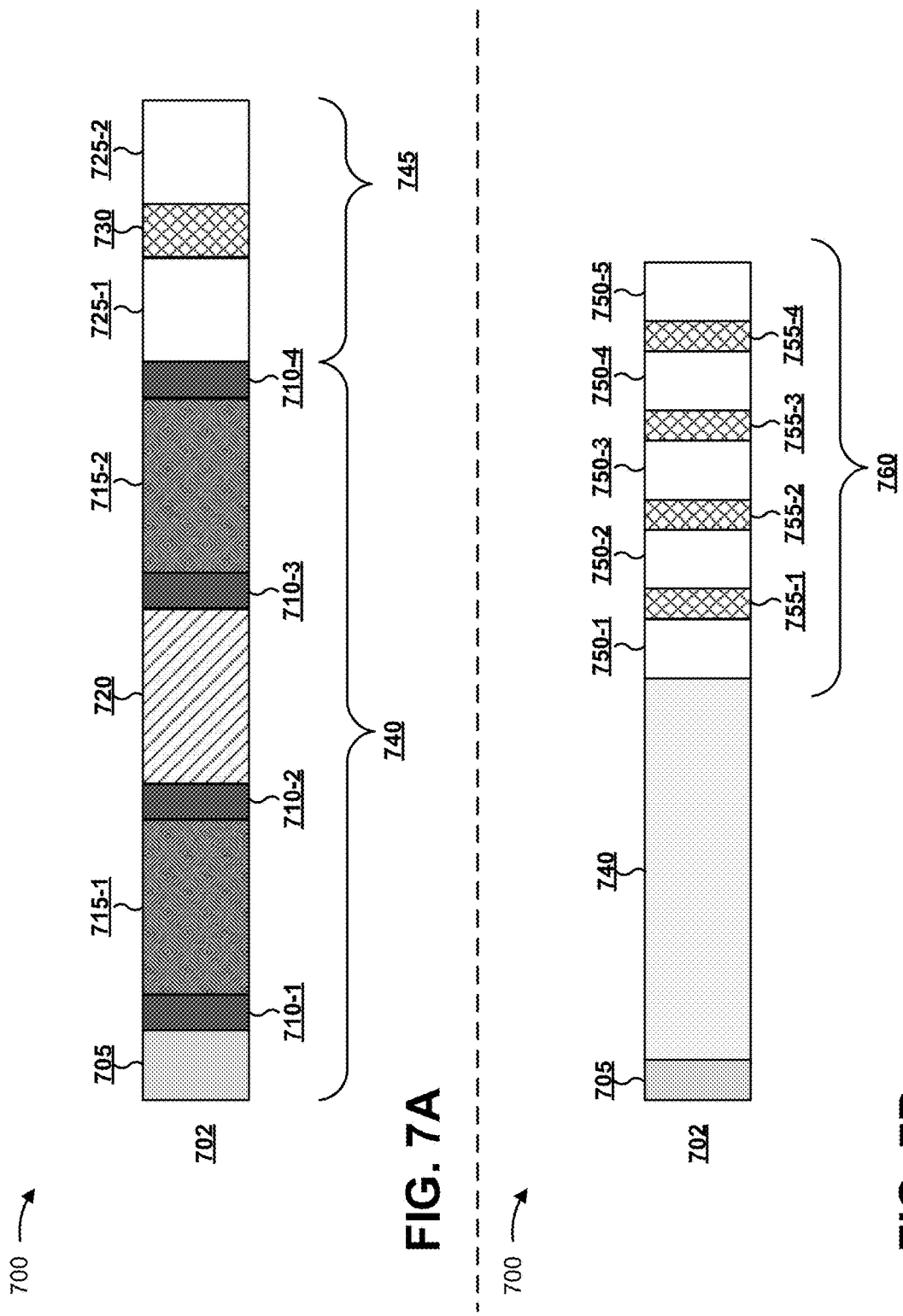

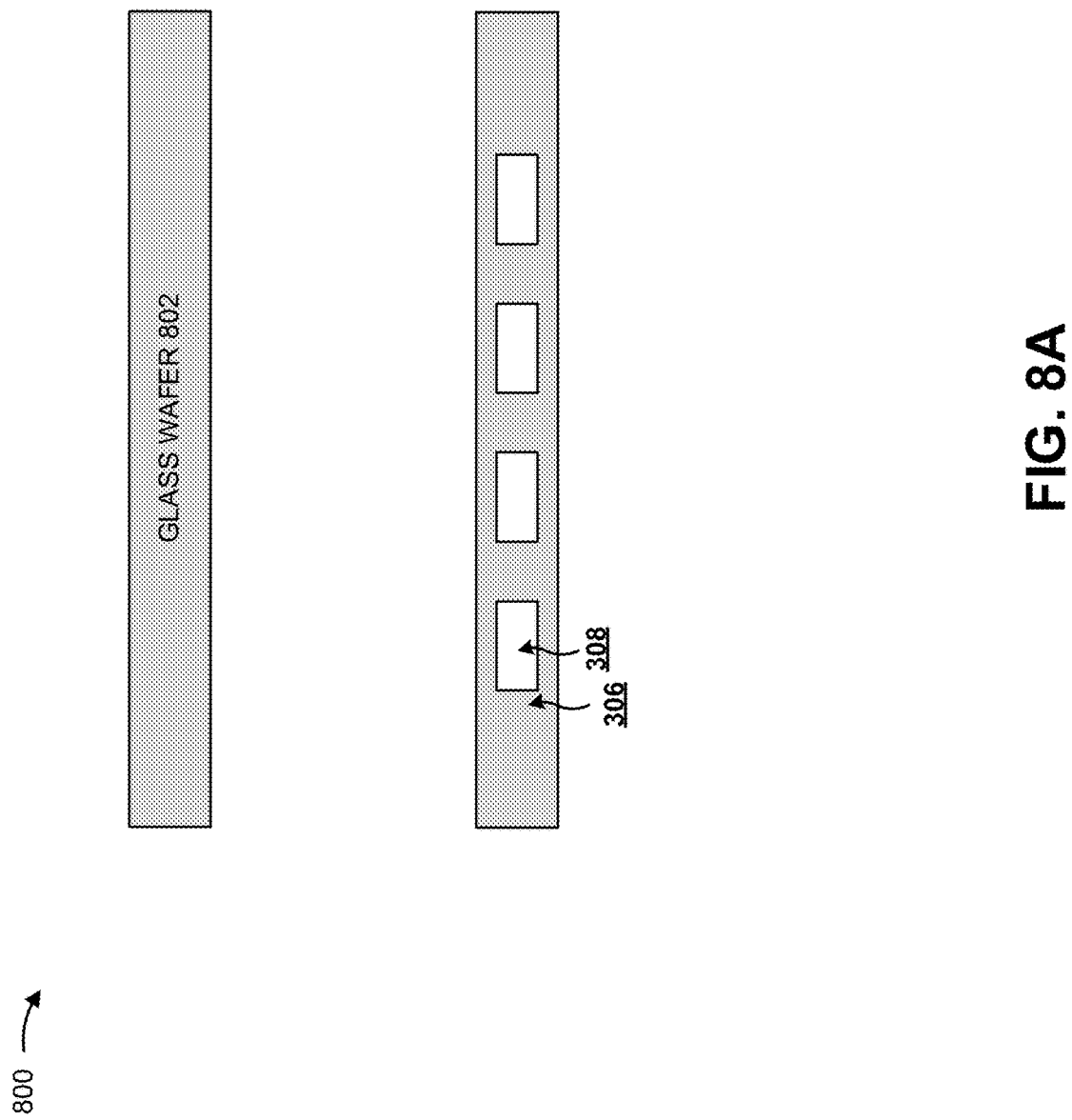

METAL MIRROR BASED MULTISPECTRAL FILTER ARRAY

RELATED APPLICATION(S)

This application claims priority under 35 U.S.C. § 119 to U.S. Provisional Patent Application No. 62/272,086, filed on Dec. 29, 2015 the content of which is incorporated by reference herein in its entirety.

This application claims priority under 35 U.S.C. § 119 to U.S. Provisional Patent Application No. 62/294,970, filed on Feb. 12, 2016, the content of which is incorporated by reference herein in its entirety.

BACKGROUND

A multispectral sensor device may be utilized to capture information. For example, the multispectral sensor device may capture information relating to a set of electromagnetic frequencies. The multispectral sensor device may include a set of sensor elements (e.g., optical sensors, spectral sensors, and/or image sensors) that capture the information. For example, an array of sensor elements may be utilized to capture information relating to multiple frequencies. A particular sensor element, of the sensor element array, may be associated with a filter that restricts a range of frequencies that are directed toward the particular sensor element.

SUMMARY

According to some possible implementations, a device may include a multispectral filter array disposed on the substrate. The multispectral filter array may include a first metal mirror disposed on the substrate. The multispectral filter may include a spacer disposed on the first metal mirror. The spacer may include a set of layers. The spacer may include a second metal mirror disposed on the spacer. The second metal mirror may be aligned with two or more sensor elements of a set of sensor elements.

According to some possible implementations, an optical filter may include a first layer. The first layer may be a first mirror to reflect a portion of light directed toward the first layer. The first layer may be deposited on a substrate associated with a set of sensor elements. The optical filter may include a second set of layers. The second set of layers may be deposited solely on the first layer. The second set of layers may be associated with a set of channels corresponding to the set of sensor elements. A channel, of the set of channels, may be associated with a particular thickness corresponding to a particular wavelength of light that is to be directed toward a particular sensor element of the set of sensor elements. The optical filter may include a third layer. The third layer may be a second metal mirror to reflect a portion of light directed toward the third layer. The third layer may be deposited on a plurality of the set of sensor elements associated with the second set of layers.

According to some possible implementations, a system may include a set of optical sensors embedded into a substrate. The system may include a multi spectral filter array deposited on the substrate. The multispectral filter array may include a first silver (Ag) metal mirror, a second silver (Ag) metal mirror, and a plurality of spacer layers disposed between the first silver (Ag) metal mirror and the second silver (Ag) metal mirror.

BRIEF DESCRIPTION OF THE DRAWINGS

FIG. 1 is a diagram of an overview of an example implementation described herein;

FIG. 2 is a diagram of an example process for fabricating a sensor device with a multi spectral filter array;

FIGS. 6A-6E are diagrams of another example implementation relating to the example process shown in FIG. 2;

FIGS. 7A and 7B are diagrams of another example implementation relating to the example process shown in FIG. 2;

FIGS. 8A and 8B are diagrams of another example implementation relating to the example process shown in FIG. 2;

DETAILED DESCRIPTION

Figure 3A:
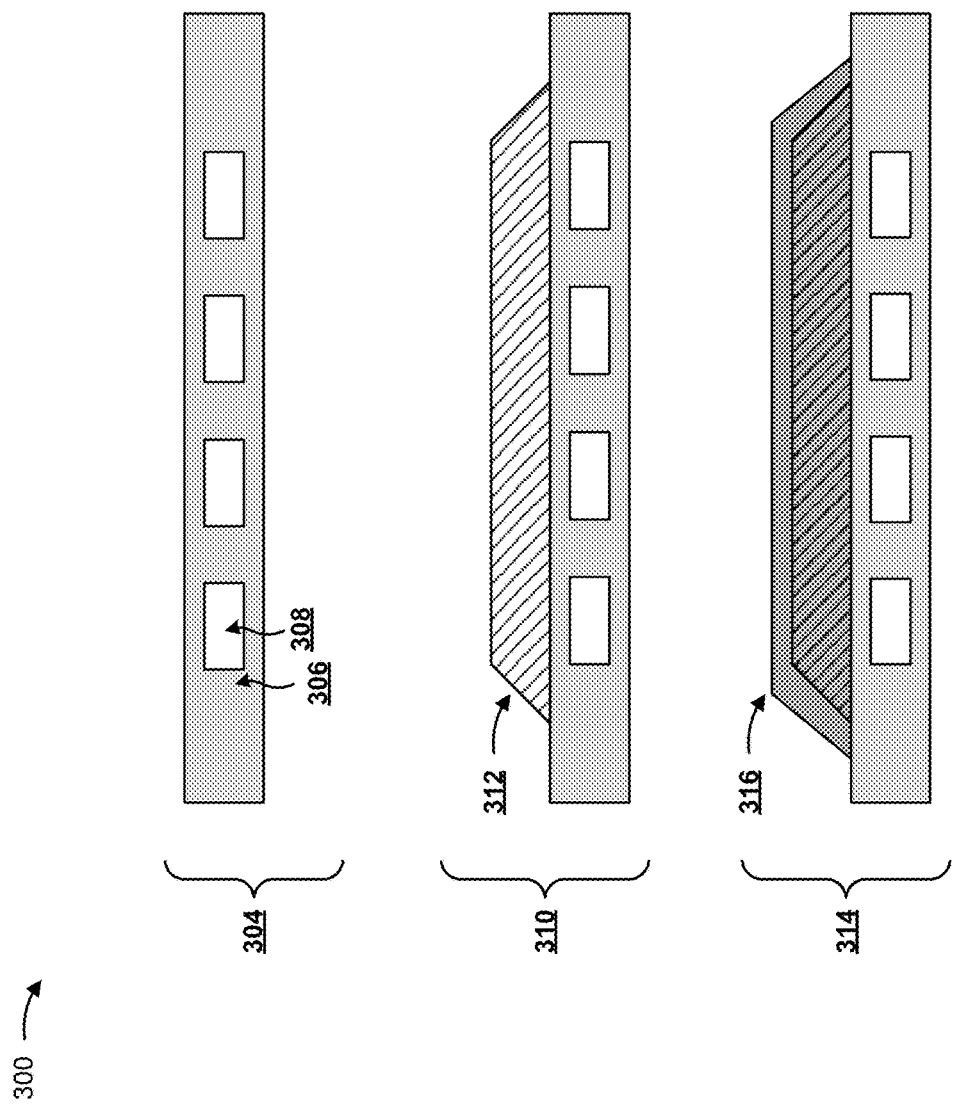
FIGS. 3A-3C are diagrams of an example implementation relating to the example process shown in FIG. 2.

The following detailed description of example implementations refers to the accompanying drawings. The same reference numbers in different drawings may identify the same or similar elements.

A sensor element (e.g., an optical sensor) may be incorporated into an optical sensor device to obtain information (e.g., spectral data) regarding a set of electromagnetic frequencies. For example, the optical sensor device may include a particular optical sensor, such as an image sensor, a multi spectral sensor, or the like that may perform a sensor measurement of light directed toward the particular optical sensor. In this case, the optical sensor may utilize one or more image sensor technologies, such as an image sensor using a complementary metal-oxide-semiconductor (CMOS) technology, an image sensor using a charge-coupled device (CCD) technology, or the like. The optical sensor device may include multiple sensor elements (e.g., an array of sensor elements), each configured to obtain information. Additionally, or alternatively, the optical sensor device may include a set of sensor elements (e.g., optical sensors) configured to obtain a set of images, each associated with a different wavelength of light.

A sensor element may be associated with a filter that filters light to the sensor element. For example, the sensor element may be aligned with a linear variable filter (LVF), a circular variable filter (CVF), a Fabry-Perot filter, or the like to cause a portion of light directed toward to the sensor element to be filtered. However, it may be difficult to integrate a filter array using LVFs or CVFs or pattern a filter in association with a semiconductor. Moreover, some sets of filters, that are utilized for multispectral sensing, may be associated with relatively high angle shift values, relatively small spectral ranges, or the like, which may reduce a spectral range of information that can be captured or an accuracy of information that is captured.

Implementations, described herein, may utilize an environmentally durable filter array using metal mirrors for multispectral sensing. In this way, an optical filter may be provided for an optical sensor device with improved durability, improved spectral range, and reduced angle shift relative to one or more other types of filters. Moreover, a difficulty in incorporating a filter onto a semiconductor-based sensor element or sensor element array may be reduced relative to one or more other types of filters.

FIG. 1 is a diagram of an overview of an example implementation 100 described herein. As shown in FIG. 1, a multispectral filter 105 (e.g., a binary structure filter array) may include a first mirror 110-1, a second mirror 110-2, and a spacer 120.

As further shown in FIG. 1, first mirror 110-1 and second mirror 110-2 may sandwich spacer 120. In other words, spacer 120 may separate first mirror 110-1 and second mirror 110-2 by a threshold distance, and/or faces of spacer 120 may be enclosed by first mirror 110-1 and second mirror 110-2. In some implementations, mirrors 110 may be associated with a particular material. For example, mirrors 110 may be deposited layers of metal (e.g., silver). Mirrors 110 may align with each sensor element of a sensor element array associated with each channel of the multi spectral filter array.

In some implementations, spacer 120 may include one or more spacer layers 130. For example, spacer 120 may include a set of spacer layers 130-1 through 130-5 (e.g., dielectric layers). In some implementations, a thickness of one or more layers 130 may be associated with ensuring a minimum spacer thickness for a particular wavelength.

In some examples, such as for a wavelength of 380 nanometers (nm) that is directed toward one or more sensors, layer 130-1 may be associated with a thickness of 77.6 nm for a spacer material with a refractive index of 2.448 and an optical thickness of 190 nm. In this way, spacer 120 ensures a minimum separation between mirrors 110 for a minimum wavelength of light that is to be directed toward one or more sensor elements. In some implementations, a thickness of one or more spacer layers 130 may be related based on a binary progression. For example, spacer layer 130-2 may be associated with a thickness of approximately 56.6 nanometers (nm), spacer layer 130-3 may be associated with a thickness of approximately 28.3 nm, spacer layer 130-4 may be associated with a thickness of approximately 14.1 nm, and spacer layer 130-5 may be associated with a thickness of approximately 7.1 nm.

In some implementations, multi spectral filter 105 may be deposited onto a substrate associated with an optical sensor device. For example, mirror 110-1 may be deposited (e.g., via a deposition process and/or a photolithographic lift-off process) onto a substrate that includes an array of sensor elements to capture information (e.g., spectral data). In some implementations, spacer 120 may permit capture of information relating to multiple wavelengths. For example, a first portion of spacer 120 aligned with a first sensor element (e.g., a back illuminated optical sensor or a front illuminated optical sensor of a sensor array) may be associated with a first thickness and a second portion of spacer 120 aligned with a second sensor element may be associated with a second thickness. In this case, light that is directed toward the first sensor element and the second sensor element may correspond to a first wavelength at the first sensor element based on the first thickness and a second wavelength at the second sensor element based on the second thickness. In this way, multi spectral filter 105 permits multispectral sensing by an optical sensor device using a spacer (e.g., spacer 120) associated with multiple portions, which are associated with multiple thicknesses, aligned to multiple sensor elements of the optical sensor device.

In some implementations, mirrors 110 may be associated with a protective layer. For example, a protective layer may be deposited onto mirror 110-1 (e.g., between mirror 110-1 and spacer 120) to reduce a likelihood of degradation of mirror 110-1, thereby improving durability of an optical sensor device utilizing multi spectral filter 105. In some implementations, mirrors 110 and/or spacer 120 may be associated with a tapered edge. For example, as described herein, an edge portion of mirror 110 and/or spacer 120 may be tapered and may permit another layer (e.g., a protective layer) to be deposited on the edge portion to reduce a likelihood of degradation of the edge portion without obstructing another portion of mirror 110 and/or spacer 120 (e.g., a non-edge portion) associated with directing light toward an optical sensor, thereby improving durability of an optical sensor device utilizing multispectral filter 105.

As indicated above, FIG. 1 is provided merely as an example. Other examples are possible and may differ from what was described with regard to FIG. 1.

Figure 3B:
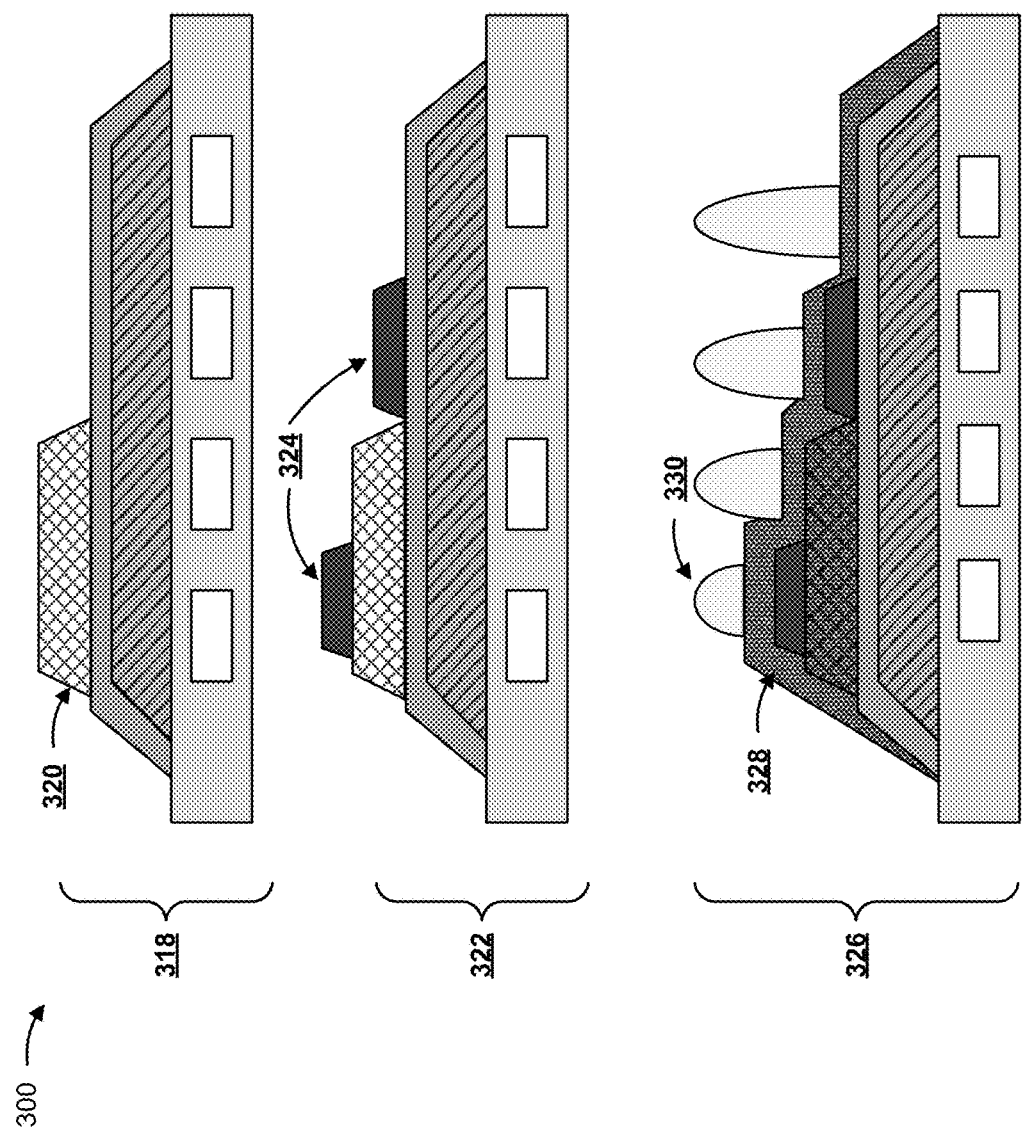
Figure 3C:
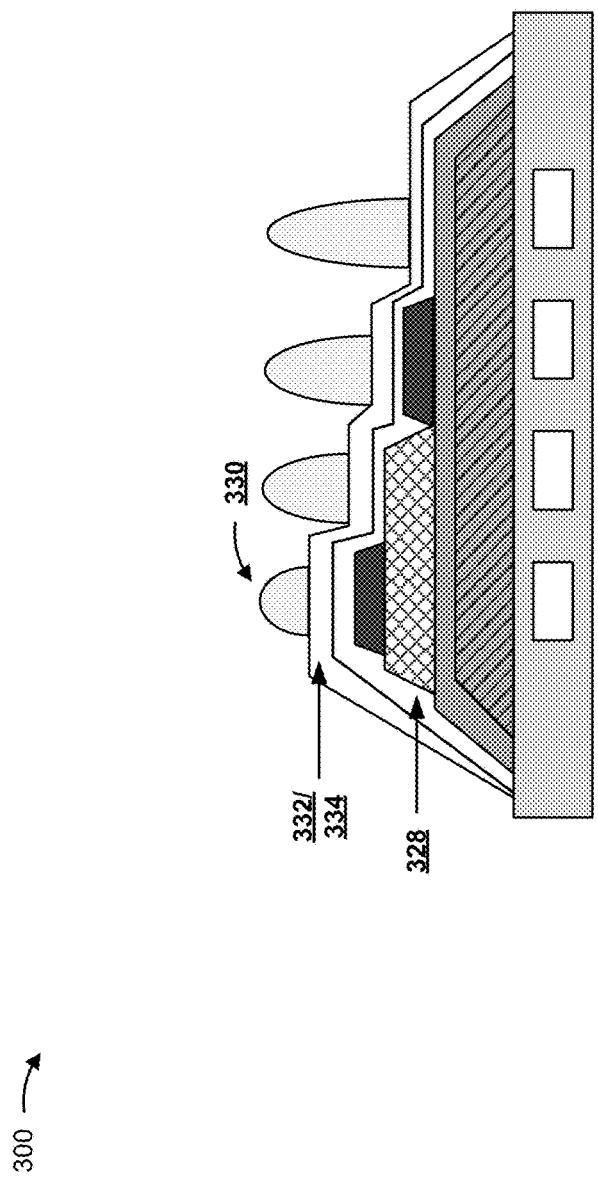

FIG. 2 is a flow chart illustrating an example process 200 for fabricating an optical sensor device with a multispectral filter array, such as multispectral filter 105 shown in FIG. 1. Process 200 may be applied to the design of an optical sensor device with a multispectral filter array used to capture information relating to a spectral measurement. FIGS. 3A-3C are diagrams of an example implementation 300 relating to example process 200 shown in FIG. 2.

As shown in FIG. 2, process 200 may include starting fabrication on an optical sensor device (block 210). For example, as shown in FIG. 3A, and by reference number 304, a substrate 306 may include a set of sensor elements 308 embedded into substrate 306. In some implementations, substrate 306 may be associated with a particular composition. For example, substrate 306 may include a silicon-based substrate or the like. In another example, substrate 306 may include a glass-based substrate, and sensor elements 308 are disposed in a silicon-based wafer, which is bonded to the glass-based substrate as described herein in terms of FIGS. 8A and 8B. Additionally, or alternatively, substrate 306 may be associated with a multispectral filter array that is associated with a relatively low wavelength or spectral shift under a relatively high temperature condition (e.g., a heat tolerant filter array).

In some implementations, substrate 306 may include one or more conductive pathways (not shown) to provide information obtained by the set of sensor elements 308. For example, substrate 306 may include a set of conductive pathways permitting substrate 306 to be mounted to another device and provide data from the set of sensor elements 308 to the other device, such as a camera device, a scanning device, a measurement device, a processor device, a microcontroller device, or the like. In some implementations, substrate 306 may be associated with multiple layers of substrate material. For example, substrate 306 may include a multi-layer substrate, a layer of which is associated with receiving the set of sensor elements 308.

In some implementations, substrate 306 may be associated with a particular type of sensor element 308. For example, substrate 306 may be associated with one or more photodiodes (e.g., a photodiode array), one or more sensor elements of a sensor array coating or in a proximity to CMOS technology, CCD technology, or the like. In some implementations, substrate 306 may be associated with a set of back illuminated optical sensors. In this case, substrate 306 may be thinner relative to another configuration, thereby permitting light to be directed through a silicon surface toward the optical sensors.

As further shown in FIG. 2, process 200 may include depositing multiple layers of a multispectral filter array onto a substrate associated with the optical sensor device (block 220). For example, as further shown in FIG. 3A, and by reference number 310, a first mirror structure 312 may be deposited onto substrate 306. In some implementations, first mirror structure 312 may be a single, solid metal mirror disposed in alignment with a set of sensor elements of the optical sensor device (e.g., sensor elements 308). In some implementations, first mirror structure 312 may be associated with a uniform thickness. In some implementations, first mirror structure 312 may be disposed within a threshold proximity of substrate 306, such as onto an intermediate layer between substrate 306 and first mirror structure 312. In other words, first mirror structure 312 is not necessarily disposed onto substrate 306, but may be disposed onto an intermediate layer between substrate 306 and first mirror structure 312. In some implementations, mirror structure 312 may be associated with a particular composition, such as a metallic composition (e.g., a metal mirror). For example, mirror structure 312 may utilize a silver (Ag)-based material, an aluminum (Al)-based material, a copper (Cu)-based material, or the like. In some implementations, mirror structure 312 may include a partially transparent material. For example, mirror structure 312 may permit a first portion of light (e.g., a first wavelength band) to be directed toward the set of sensor elements 308 and a second portion of light (e.g., a second wavelength band) to be re-directed away from the set of sensor elements 308. In some implementations, mirror structure 312 and/or one or more other layers may be deposited onto substrate 306 or onto another layer using a pulsed magnetron sputtering deposition process, a lift-off process, or the like. For example, a coating platform may be associated with depositing mirror structure 312 with a thickness of between 40 nm and 50 nm or another similar thickness using a particular deposition process. Similarly, a coating platform may be associated with a particular semiconductor wafer size (e.g., a 200 millimeter (mm) wafer or a 300 mm wafer), and may utilize a pulsed magnetron to perform deposition of spacer layers, described herein, of a particular thickness (e.g., a less than 5 nanometers (nm) thickness, a less than 2 nm thickness, or a less than 1 nm thickness for some spacer layers and other thicknesses, such as greater than 5 nm, greater than 50 nm, or greater than 100 nm for other spacer layers).

In some implementations, a set of spacer layers of a spacer may be deposited to separate mirror structure 312 from another mirror structure. For example, as further shown in FIG. 3A, and by reference number 314, a first spacer layer 316 of a spacer may be deposited onto mirror structure 312 (e.g., using a pulsed magnetron sputtering deposition process). In some implementations, first spacer layer 316 may be deposited onto mirror structure 312 based on a patterning technique. For example, a lift-off process may be utilized to form first spacer layer 316 with a particular thickness. First spacer layer 316 and/or another spacer layer may be disposed completely onto mirror structure 312. For example, first spacer layer 316 may include one or more discrete portions that form a continuous spacer layer on a continuous, solid metal mirror. In this case, first spacer layer 316 and/or one or more other spacer layers may form a plurality of channels aligned with the set of sensor elements, which as a complete set of layers with first mirror structure 312 and another mirror structure, described herein, direct light toward a corresponding plurality of sensor elements 308.

In some implementations, first spacer layer 316, in association with first mirror structure 312 and another mirror structure, described herein, may be associated with performing a particular filtering functionality. In some implementations, based on a desired spectral range (e.g., between approximately 380 nanometers and approximately 1100 nanometers) or a desire for a reduced angle shift, first spacer layer 316 and/or one or more other spacer layers may utilize an oxide-based material (e.g., niobium oxide, titanium oxide, tantalum oxide, or a combination thereof for a visible spectral range), a silicon-based material (e.g., silicon hydride (SiH) for a spectral range greater than 650 nm, silicon carbide (SiC), or silicon (Si)), a germanium (Ge)-based material (e.g., for an infrared spectral range), or the like. In some implementations, first spacer layer 316 may utilize a particular material to achieve a reduction in angle shift relative to another material. For example, utilizing an Si—H based material may result in a reduced angle shift relative to using a silicon-dioxide ($SiO_2$)-based material. In another example, first spacer layer 316 may utilize another type of oxide material, nitride material, fluoride material, or the like.

As shown in FIG. 3B, and by reference number 318, a second spacer layer 320 may be deposited onto first spacer layer 316. For example, second spacer layer 320 may be deposited using a reactive magnetron sputtering process, a pulsed-magnetron sputtering process, an ion beam assisted deposition process, an ion beam sputtering process, a dual ion beam sputtering process, a reactive direct current sputtering process, an alternating current sputtering process, a radio frequency sputtering process, an atomic layer deposition process, or the like. Additionally, or alternatively, other depositions, described herein, such as for layers 312, 316, 320, etc. may be similarly deposited. Although described herein in terms of a particular order of deposition of layers, another order of deposition of layers may be utilized. In some implementations, second spacer 120 may be associated with a thickness relating to first spacer layer 316. For example, when first spacer layer 316 is associated with a first thickness to, second spacer layer 320 may be deposited with a second thickness $t_1$. In some implementations, second spacer layer 320 may be deposited onto a portion of first spacer layer 316. For example, based on a desired spacer thickness arrangement for a set of channels (e.g., for a set of sensor elements 308 associated with the set of channels), second spacer layer 320 may be deposited onto a subset of a surface of first spacer layer 316 to cause a first sensor element 308 to be associated with a first spacer thickness and a second sensor element 308 to be associated with a second spacer thickness, thereby permitting first sensor element 308 to capture information associated with a first wavelength and second sensor element 308 to capture information associated with a second wavelength. For example, a first layer may be deposited and may cover a set of sensor elements, a second layer may be deposited and may cover half of the set of sensor elements, a third layer may be deposited and may cover a portion of the set of sensor elements, etc. Further details regarding patterning of a set of spacer layers are described with regard to FIGS. 4A-4C and FIGS. 5A and 5B.

As further shown in FIG. 3B, and by reference number 322, a third spacer layer 324 may be deposited onto second spacer layer 320 and/or first spacer layer 316. For example, third spacer layer 324 and/or one or more subsequent spacer layers (not shown) may be deposited. In some implementations, third spacer layer 324 (and/or one or more other spacer layers n, where n≥2) may be associated with half a thickness of a previous layer (e.g., second spacer layer 320 for third spacer layer 324). In other words, third spacer layer 324 may have a thickness of ½ of the thickness of second spacer layer 320. In some implementations, third spacer layer 324 may be selectively deposited onto a portion of first spacer layer 316 and/or second spacer layer 320. For example, a first portion of third spacer layer 324 may be deposited onto a portion of first spacer layer 316 and a second portion of third spacer layer 324 may be deposited onto a portion of second spacer layer 320, thereby permitting multiple sensor elements 308 to be associated with multiple spacer thicknesses and capture information associated with multiple wavelengths.

As further shown in FIG. 3B, and by reference number 326, a mirror structure 328 may be deposited. For example, mirror structure 328 may be deposited onto one or more portions of one or more layers (e.g., first spacer layer 316, second spacer layer 320, third spacer layer 324, or another subsequent layer). In some implementations, mirror structure 328 may be a solid, metal mirror disposed in alignment with optical sensors of the optical sensor device (e.g., sensor elements 308). Based on spacer layers 316, 320, and 324 being deposited, mirror structure 328 is separated from mirror structure 312 by a spacer. In this way, light may be directed toward one or more sensor elements 308 at one or more wavelengths. In some implementations, another layer may be deposited between mirror structure 328 and spacer layer 324. For example, a protective frame layer, a thin film layer, or the like may be deposited to perform one or more functionalities. As shown in FIG. 3C, before depositing lenses 330, an out-of-band blocker set of layers 332 (e.g., a set of layers forming a patterned blocker) may be deposited. Alternatively, an anti-reflective coating set of layers 334 may be deposited. In some implementations, multiple discrete filter coatings may be deposited. Additionally, or alternatively, a single blocker may be deposited to suppress out-of-band light for multiple wavelengths, multiple channels, or the like. In another example, a protective layer may be provided, such as a Zinc Oxide (ZnO) layer encapsulating the silver of the mirror structures.

As further shown in FIG. 2, process 200, in some implementations, may include depositing one or more other layers associated with the multi spectral filter array (block 230). For example, a filter, such as an anti-reflective coating filter, an out-of-band blocking filter, a higher-order suppression filter, or the like may be deposited, such as onto mirror structure 328, as described in detail, herein, with regard to FIGS. 7A and 7B and FIG. 9.

As further shown in FIG. 2, process 200 may include finalizing the optical sensor device with the multi spectral filter array (block 240). For example, as further shown in FIG. 3B, and by reference number 326, a set of lenses 330 may be attached to mirror structure 328. For example, a particular lens 330, such as a glass lens, a plastic lens, or the like, may be attached to mirror structure 328 to alter a characteristic of light that is directed toward a corresponding sensor element 308, such as to focus the light, distort the light, direct the light, increase an angle tolerance with which light may enter the optical sensor device, increase an amount of light that is directed toward sensor element 308 of the optical sensor device, or the like.

In this way, a multispectral (e.g., a binary structure) Fabry-Perot filter array may be constructed using metal mirrors. In some implementations, an $Nb_2O_5$-based spacer or a $TiO_2$-based spacer may be preferred for a visible spectral range. In some implementations, a combination of $Nb_2O_5$ and Si:H or $TiO_2$ and Si:H may be preferred for a near infrared (NIR) spectral range (e.g., from 750 nm to 1100 nm). In some implementations, amorphous silicon or hydrogenated amorphous silicon may be used. Additionally, or alternatively, based on utilizing Ag-based metal mirrors, a relatively large spectral bandwidth may be achieved. Additionally, or alternatively, based on utilizing a pulsed magnetron sputtering process and/or a liftoff process, the multispectral Fabry-Perot filter array may be incorporated into an optical sensor device with a semiconductor substrate without an excessive difficulty of manufacture.

Although FIG. 2 shows example blocks of process 200, in some implementations, process 200 may include additional blocks, fewer blocks, different blocks, or differently arranged blocks than those depicted in FIG. 2. Additionally, or alternatively, two or more of the blocks of process 200 may be performed in parallel. As indicated above, FIGS. 3A-3C are provided merely as an example. Other examples are possible and may differ from what was described with regard to FIGS. 3A-3C.

Figure 4A:
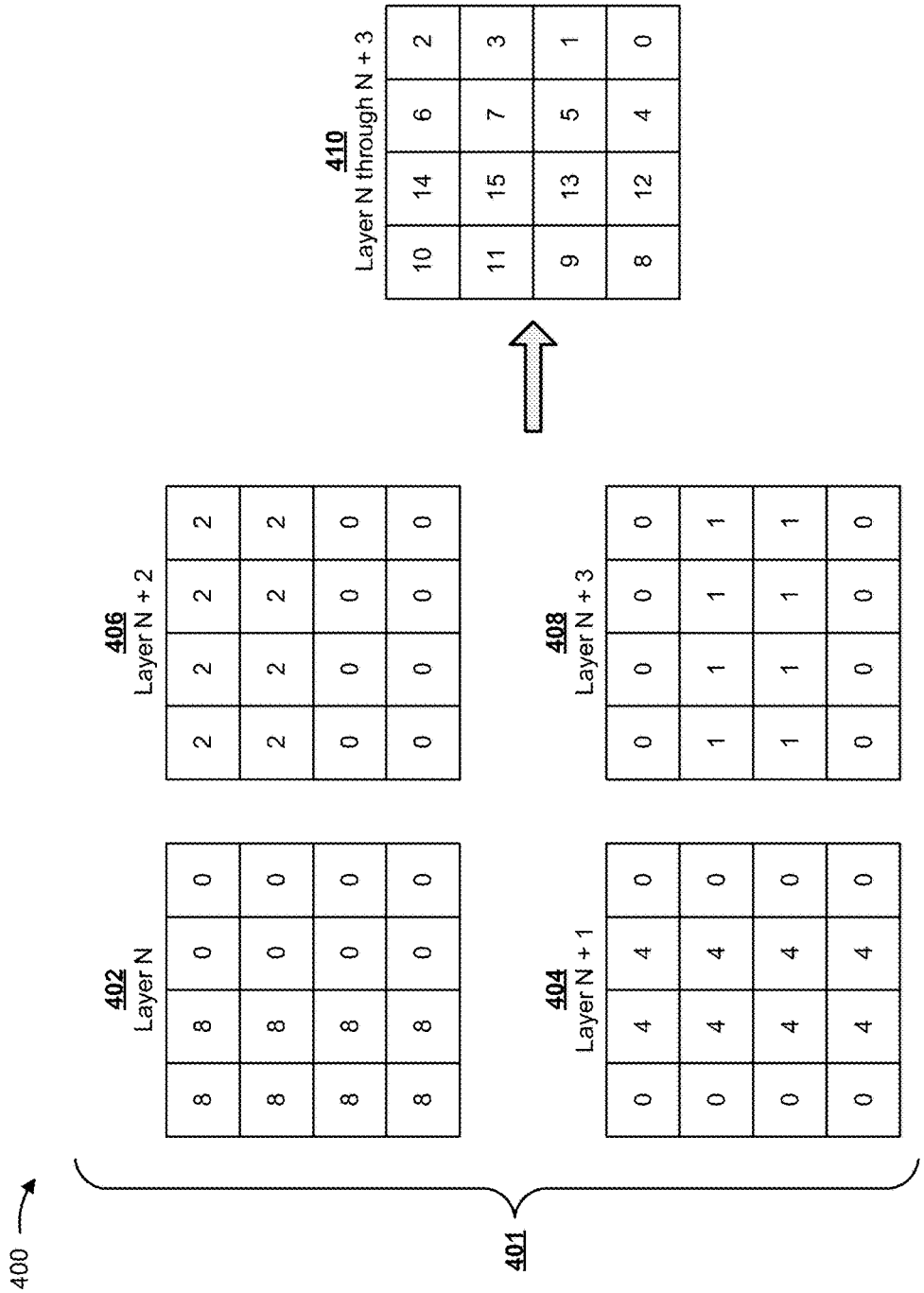
FIGS. 4A-4C are diagrams of another example implementation relating to the example process shown in FIG. 2.
Figure 4B:
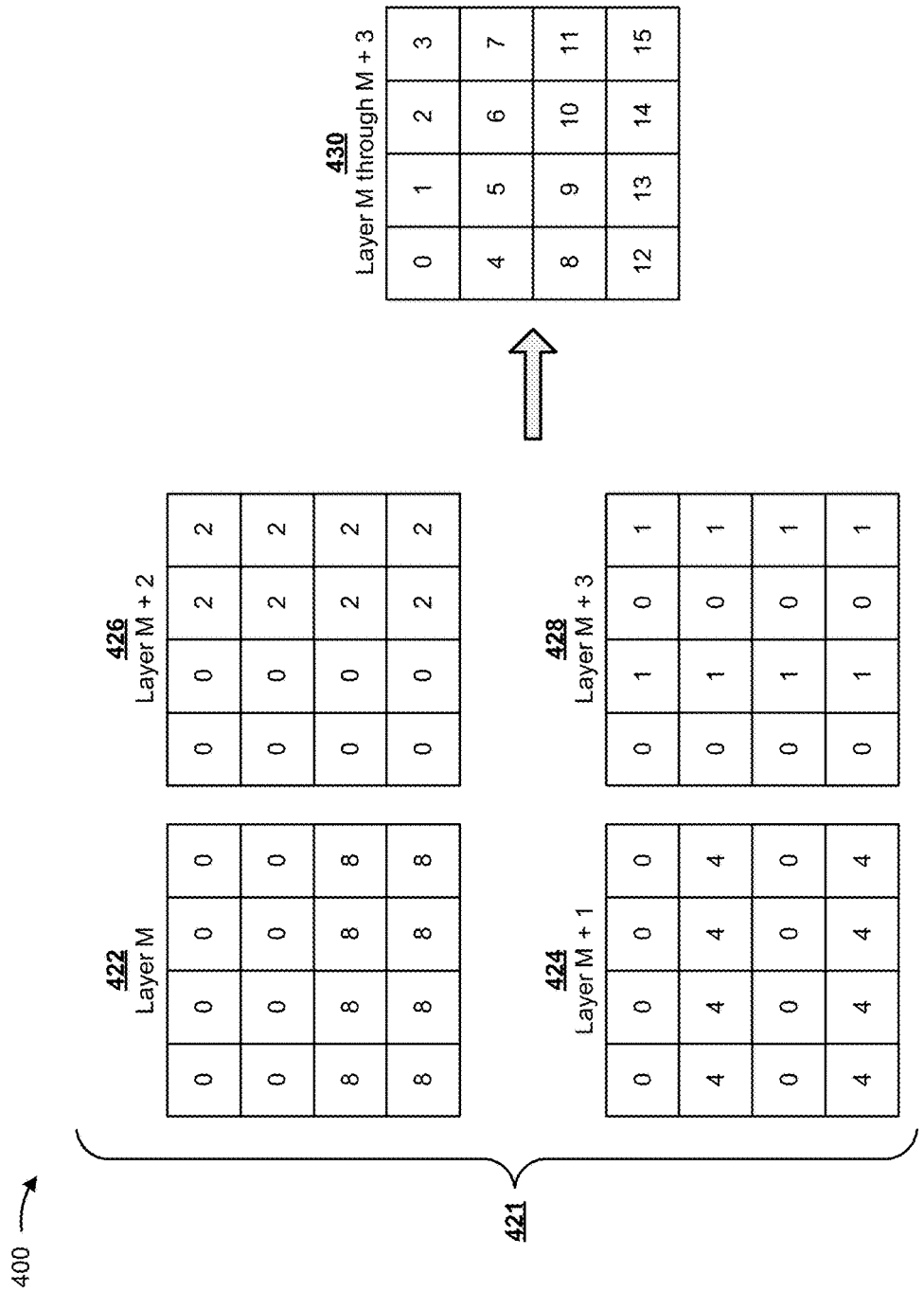
Figure 4C:
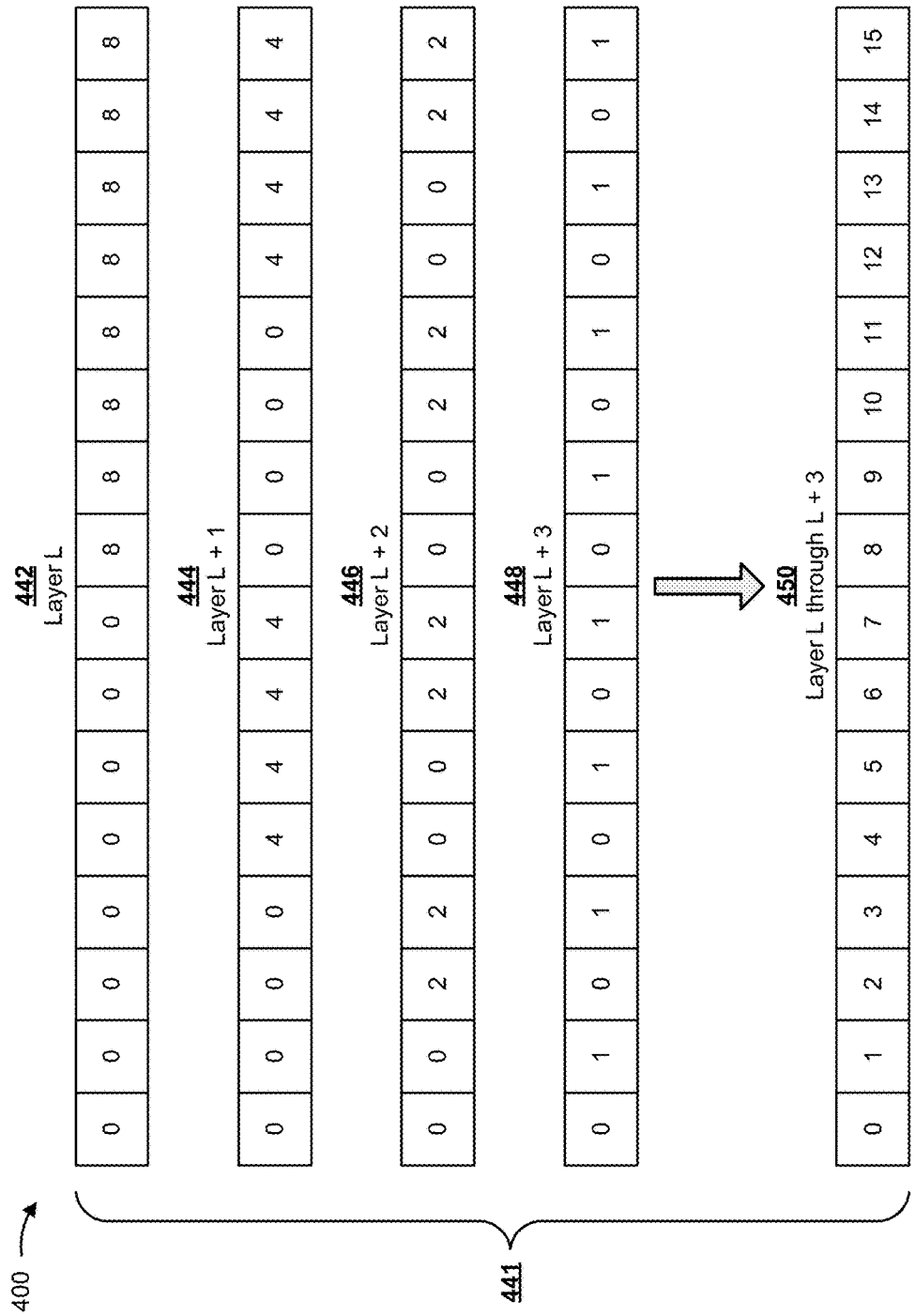

FIGS. 4A-4C are diagrams of an example implementation 400 relating to the example process 200 shown in FIG. 2. FIGS. 4A-4C show an example of a filter array layout for a multispectral filter.

As shown in FIG. 4A, a filter array 401 may be associated with a set of layers. Filter array 401 may be a 4×4 filter array including 16 channels (e.g., optical channels) corresponding to 16 sensor elements. In some implementations, filter array 401 corresponds to the example multispectral filter 105 shown in cross-section in FIG. 1. In some implementations, each channel may be associated with a sensor array. For example, a channel may include a sensor array with a set of sensor elements associated with capturing information regarding light directed from a light source using the channel. In some implementations, each channel may be associated with a particular thickness for each layer. A thickness of a set of layers of a channel may be selected based on a desired wavelength of information that is to be captured by an optical sensor corresponding to the channel. In some implementations, the 4×4 filter array (e.g., or another dimension filter array) may be associated with a particular patterning, such as a mosaic pattern (e.g., a snapshot Bayer mosaic pattern), a tiled pattern (e.g., a snapshot tiled pattern), a line pattern (e.g., a continuous line-scan pattern or a discontinuous line-scan pattern), or the like.

Based on the spectral range that is to be captured by the optical sensor, a thickness of a spacer layer sandwiched by mirrors of the 4×4 filter array may be determined:

$$t_{max} = 2*(\lambda_{max}/(4*n_{ref}));$$

$$t_{min} = 2*(\lambda_{min}/(4*n_{ref}));$$

where $t_{max}$ represents a total thickness of a spacer layer separating a set of mirror structures for a highest center wavelength for which information is to be captured, $\lambda_{max}$ represents the highest center wavelength for which information is to be captured, $n_{ref}$ represents a refractive index of the spacer layer, $t_{min}$ represents a total thickness of a spacer layer separating a set of mirror structures for a lowest center wavelength for which information is to be captured, and $\lambda_{min}$ represents the lowest center wavelength for which information is to be captured.

A quantity of layers of the spacer layers that are to be deposited to form the set of channels (e.g., 16 channels of the 4×4 filter array) may be determined:

$$c = 2^x;$$

where c represents a maximum number of channels that can be created for a given quantity of spacer layers that are deposited x. In some implementations, less than a maximum quantity of channels may be selected for a particular quantity of spacer layers. For example, although a maximum of 16 channels may be created with a deposition of 4 spacer layers, another quantity of channels may be selected for the 4 spacer layers, such as 9 channels, 10 channels, or the like. In this case, one or more channels may be omitted or duplicated. For example, when a particular optical sensor is associated with poor performance for capturing information regarding a particular wavelength, information regarding the particular wavelength may be caused to be captured by multiple optical sensors associated with multiple channels to improve accuracy of the information.

A thickness for each layer of the spacer layers of a particular channel (e.g., for a set of equidistant channels) may be determined:

$$t_0 = t_{min};$$

$$t_1 = (c/2)/((c-1)*2*n_{ref})*(\lambda_{max} - \lambda_{min});$$

$$t_n = t_{n-1}/2;$$

$$n = \log_2(c);$$

where $t_n$ represents a thickness of an nth layer (e.g., to is a first layer and $t_1$ is a second layer) and c represents a channel number for a channel of a set of channels. In some implementations, a set of non-equidistant channels may be utilized. For example, a discontinuous patterning of channels may be selected to obtain information regarding a first set of wavelengths and a second set of wavelengths that is discontinuous with the first set of wavelengths. In this case, $t_{min}$ and $t_{max}$ may still be determined, but a different set of intermediate layers may be selected. In some implementations, a different quantity of channels may be utilized. Additionally, or alternatively, a patterning of channels may be utilized with multiple channels having a common thickness, thereby permitting multiple optical sensors to capture information regarding a common wavelength of light.

As shown by reference number 402, filter array 401 includes a layer 402 (e.g., of a spacer layer between a first mirror structure and a second mirror structure), N, for which each channel is associated with a particular thickness to cause a particular wavelength of light to be directed toward a corresponding optical sensor. For example, a first group of channels of layer 402 are associated with a thickness of $8*t_4$, indicating that a layer of thickness $8*t_4$ is deposited (where $t_4$ represents a thickness of a fourth layer) (e.g., onto a first mirror structure or onto another layer, such as an oxide-based protective layer that is deposited onto the first mirror structure). Similarly, a second group of channels of layer 402 are associated with a thickness of $0*t_4$, indicating that for these channels, deposition is performed, but lift-off is used to remove material that is deposited.

As further shown in FIG. 4A, and by reference number 404, a layer 404, N+1, is deposited onto layer 402. Layer 404 includes a first group of channels associated with a thickness of $4*t_4$ and a second group of channels associated with a thickness of $0*t_4$. In some implementations, a thickness of layer 404 is selected based on a thickness of layer 402. For example, when manufacturing a multispectral filter (e.g., a filter associated with a binary progression of filter layers), the thickness of layer 404 may be selected as one half the thickness of layer 402. In another example, another relationship between layer 402 and layer 404 may be utilized. For example, layer 404 may be 75% a thickness of layer 402 and a subsequent layer may be 33%, 25%, etc. the thickness of layer 404. In another example, layer 404 may be 50% a thickness of layer 402 and a subsequent layer may be 33% a thickness of layer 404, 10% a thickness of layer 404, or the like.

As further shown in FIG. 4A, and by reference number 406, a layer 406, N+2, is deposited onto layer 404. Layer 406 includes a first group of channels associated with a thickness of $2*t_4$ and a second group of channels associated with a thickness of $0*t_4$. As shown by reference number 408, a layer 408, N+3, is deposited onto layer 406. Layer 408 includes a first group of channels associated with a thickness of $1*t_4$ and a second group of channels associated with a thickness of $0*t_4$. As shown by reference number 410, a thickness of layers N through N+3 is identified for filter array 401 based on summing a thickness of each layer for each channel. For example, based on the binary progression and the arrangement of filter layers, each channel may be associated with a different thickness, thereby permitting each corresponding optical sensor to capture information regarding a different wavelength. A thickness of layer to (e.g., $t_{min}$) onto which $t_1$ to $t_n$ are disposed may be related to a wavelength of light regarding which information (e.g., spectral data) is to be captured.

As shown in FIG. 4B, a similar filter array 421 may be associated with a set of layers, which are each associated with one or more thicknesses. As shown by reference number 422, a layer 422, M includes a first group of channels associated with a thickness of $8*t_4$ and a second group of channels associated with a thickness of $0*t_4$. As shown by reference number 424, a layer 424, M+1, includes a first group of channels associated with a thickness of $4*t_4$ and a second group of channels associated with a thickness of $0*t_4$. As shown by reference number 426, a layer 426, M+2, includes a first group of channels with a thickness of $2*t_4$ and a second group of channels with a thickness of $0*t_4$. As shown by reference number 428, a layer 428, M+3, includes a first group of channels with a thickness of $1*t_4$ and a second group of channels with a thickness of $0*t_4$. As shown by reference number 430, a result of depositing layers 422, 424, 426, and 428 is a set of thicknesses for a set of channels of filter array 421, permitting optical sensors of filter array 421 to capture information relating to a set of wavelengths.

As shown in FIG. 4C, another filter array 441 may utilize a linear arrangement of 16 channels rather than the 4×4 arrangement of filter array 401 and filter array 421. As shown by reference number 442, a layer 442, L, includes a first group of channels with a thickness of $8*t_4$ and a second group of channels with a thickness of $0*t_4$. As shown by reference number 444, a layer 444, L+1, includes a first group of channels with a thickness of $4*t_4$ and a second group of channels with a thickness of $0*t_4$. As shown by reference number 446, a layer 446, L+2, includes a first group of channels with a thickness of $2*t_4$ and a second group of channels with a thickness of $0*t_4$. As shown by reference number 448, a layer 448, L+3, includes a first group of channels with a thickness of $1*t_4$ and a second group of channels with a thickness of $0*t_4$. As shown by reference number 450, a result of depositing layers 442, 444, 446, and 448 is a set of thicknesses for a set of channels of filter array 441 to cause a set of optical sensors to capture information relating to a set of wavelengths.

As indicated above, FIGS. 4A-4C are provided merely as an example. Other examples are possible and may differ from what was described with regard to FIGS. 4A-4C.

Figure 5A:
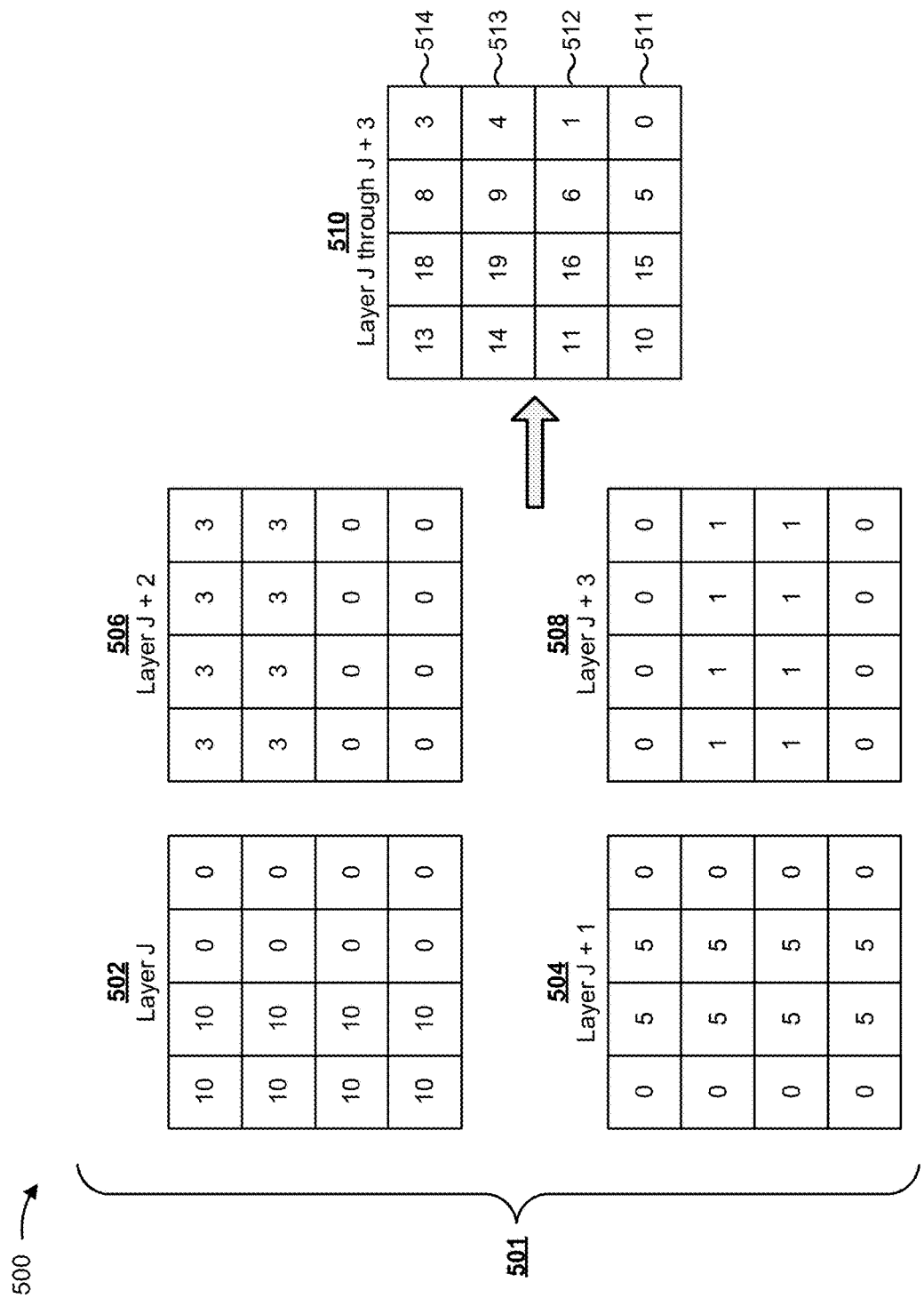
FIGS. 5A and 5B are diagrams of another example implementation relating to the example process shown in FIG. 2.
Figure 5B:
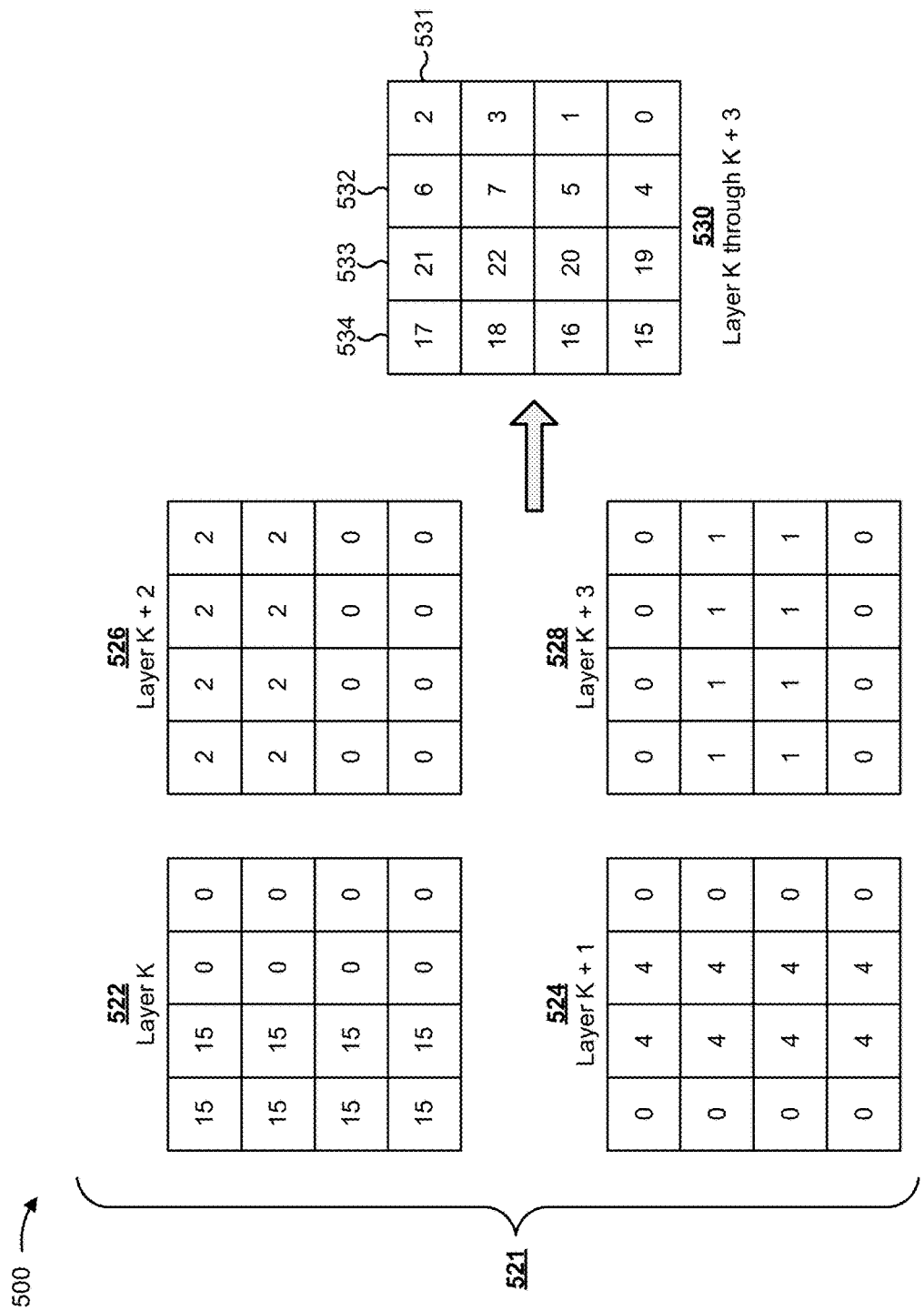

FIGS. 5A and 5B are diagrams of an example implementation 500 relating to the example process 200 shown in FIG. 2. FIGS. 5A and 5B show an example of a filter array layout for a multispectral filter with non-uniform channel spacing.

As shown in FIG. 5A, a filter array 501 (e.g., a multispectral filter) may utilize a non-equidistant channel layout.

For example, as shown by reference numbers 502 through 508, layer 502 may include a group of channels with a thickness of 10*t4, layer 504 may include a group of channels with a thickness of 5*t4, layer 506 may include a group of channels with a thickness of 3*t4, and layer 508 may include a group of channels with a thickness of 1*t4. As shown by reference number 510, a result of depositing layers 502, 504, 506, and 508 is a set of thicknesses that are not equidistant for each channel. For example, channel 511 is associated with a thickness of 0*t4, channel 512 is associated with a thickness of 1*t4, channel 513 is associated with a thickness of 4*t4, and channel 514 is associated with a thickness of 3*t4 (e.g., a channel associated with a thickness of 2*t4 is omitted). In this way, filter array 501 may permit a set of optical sensors associated with filter array 501 to capture information regarding a non-contiguous set of wavelengths (e.g., a set of wavelengths that are not separated equidistantly).

As shown in FIG. 5B, a similar filter array 521 may utilize another non-equidistant channel spacing. For example, as shown by reference numbers 522 through 528, layer 522 may include a group of channels with a thickness of 15*t4, layer 524 may include a group of channels with a thickness of 4*t4, layer 526 may include a group of channels with a thickness of 2*t4, and layer 528 may include a group of channels with a thickness of 1*t4. As shown by reference number 530, a result of depositing layers 522, 524, 526, and 528 is a set of thicknesses for a set of channels that are not equidistant. For example, channel 531 is associated with a thickness of 2*t4, channel 532 is associated with a thickness of 6*t4, channel 533 is associated with a thickness of 21*t4, and channel 534 is associated with a thickness of 17*t4 (e.g., channels of thickness 8*t4 through 14*t4, inclusive, are omitted). A discontinuity between channel 532 and channel 533 permits a set of optical sensors associated with filter array 521 to capture information regarding two ranges of wavelengths separated by an amount of spectrum not equal to a separation between other channels of filter array 521.

As indicated above, FIGS. 5A and 5B are provided merely as an example. Other examples are possible and may differ from what was described with regard to FIGS. 5A and 5B.

FIGS. 6A-6E are diagrams of an example implementation 600 relating to the example process 200 shown in FIG. 2. FIGS. 6A-6E show an example of an optical sensor device with a multi spectral filter.

As shown in FIG. 6A, substrate 602 may include one or more components. For example, substrate 602 may include a set of optical sensors 604, such as CMOS technology, CCD technology, or the like. A mirror 606 (e.g., a metal-based reflector layer) may be deposited onto optical sensors 604, and may permit a portion of light directed toward optical sensors 604 to pass through mirror 606 toward optical sensors 604. Mirror 606 may be associated with a protective coating to reduce oxidization of mirror 606. For example, a zinc-oxide (ZnO)-based material may be coated onto a silver-based mirror, such as in a ZnO/Ag/ZnO configuration, with a particular thickness of the ZnO coating. For example, the ZnO coating may be an approximately 0.5 nm to approximately 4 nm thickness, an approximately 1 nm thickness to an approximately 2 nm thickness, or the like. A first spacer layer 608 of a spacer portion of the multi spectral filter may be deposited onto mirror 606.

As shown in FIG. 6B, a second spacer layer 610 may be deposited onto a portion of first spacer layer 608 to cause a first group of channels of the filter array to be associated with a first thickness and a second group of channels of the filter array to be associated with a second thickness. In this case, second spacer layer 610 is deposited onto a portion of first spacer layer 608 aligned with optical sensors 604. In this way, a spacer of the multi spectral filter may be deposited to cause optical sensors 604 to receive light associated with a set of bandwidths (e.g., a first bandwidth associated with the first thickness or a second bandwidth associated with the second thickness).

Figure 6C:
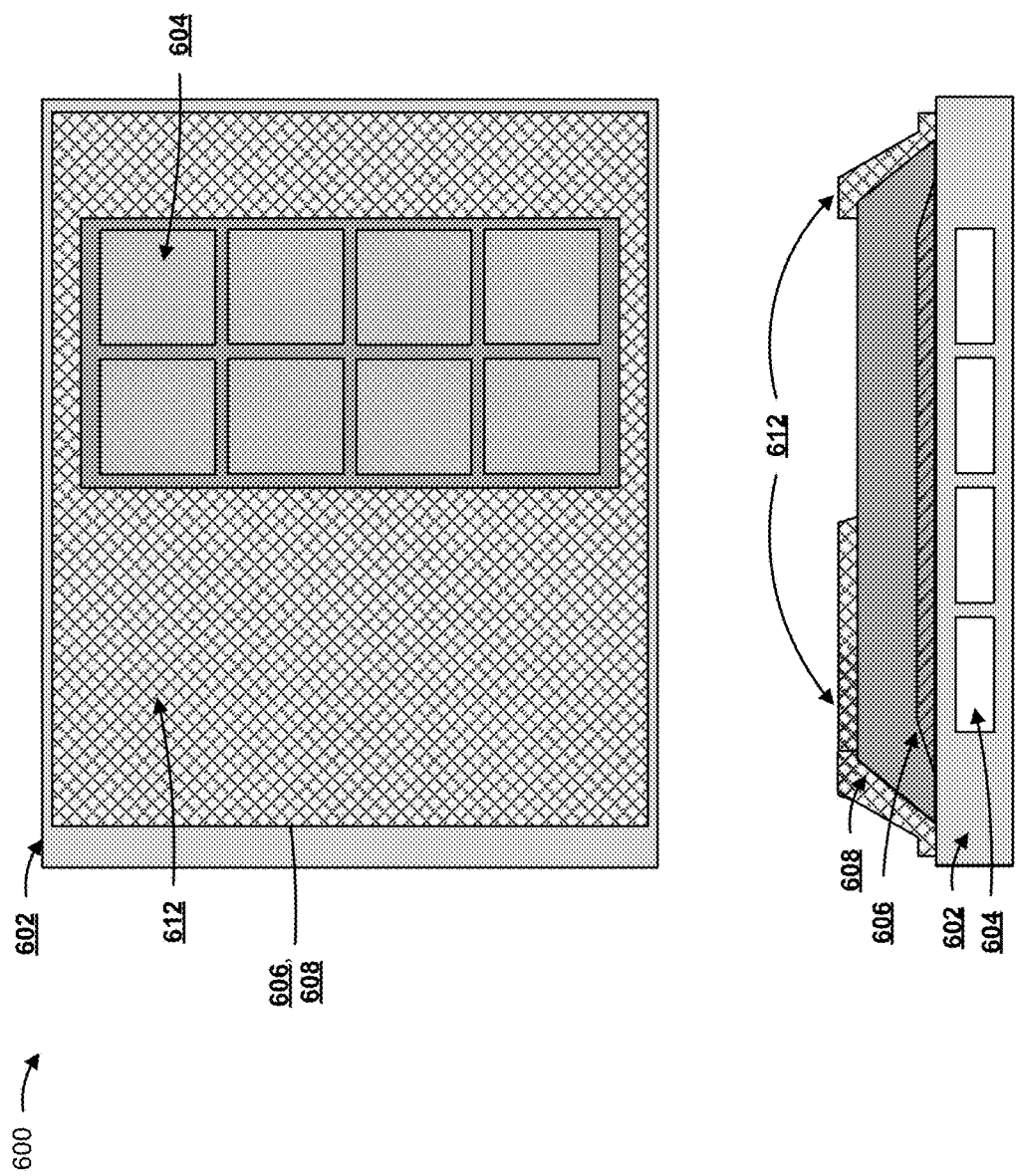

As shown in FIG. 6C, in another example, a similar second spacer layer 612 may be deposited onto a similar portion of first spacer layer 608 to cause a first group of channels of the filter array to be associated with a first thickness and a second group of channels of the filter array to be associated with a second thickness. In this case, as shown by reference number 612, second spacer layer 612 is deposited to cover an edge of first spacer layer 608 and mirror 606 rather than only the portion of the first layer aligned with optical sensors 604.

Figure 6D:
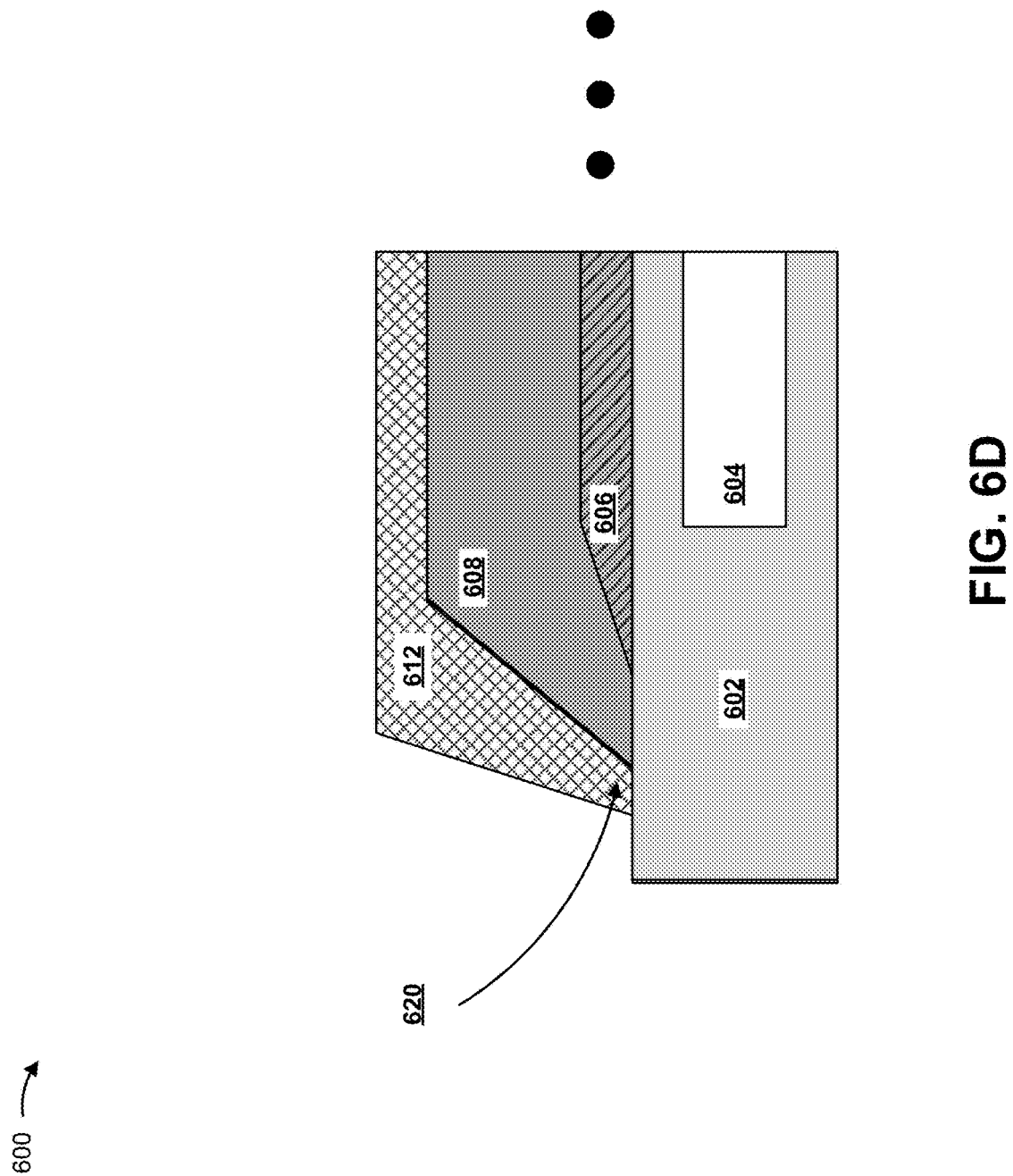

As shown in FIG. 6D, and by reference number 620, the edge of first spacer layer 608 and mirror 606 are protected by second spacer layer 612 based on second spacer layer 612 being deposited to enclose both the portion of first spacer layer 608 aligned with optical sensors 604 and the edge of first spacer layer 608 and mirror 606. In this way, second spacer layer 612 provides an integrated protective frame (e.g., a protective layer) for first spacer layer 608 and mirror 606, thereby reducing a likelihood that first spacer layer 608 and/or mirror 606 may be damaged and increasing a durability of the optical sensor device relative to another optical sensor device with a filter array with an exposed mirror and/or an exposed coating of the mirror.

As shown in FIG. 6E, a similar substrate 602 may include a set of optical sensors 604, a first mirror layer 606 disposed in a particular proximity with substrate 602, and a first spacer layer 608 disposed onto first mirror layer 606. In this case, a zinc-oxide protective layer is deposited to sandwich first metal mirror layer 606 in the particular proximity with substrate 602 thereby at least partially enclosing first metal mirror layer 606 and improving a durability of first metal mirror layer 602. A second spacer layer 622 is disposed onto a portion of first spacer layer 608 (e.g., aligned to a subset of the set of optical sensors 604 and/or pixels corresponding to the subset of optical sensors 604). A frame 624 is disposed onto a portion of substrate 602, a portion of first spacer layer 608, and/or a portion of second spacer layer 620 to provide a protective frame (e.g., a protective layer), thereby reducing a likelihood that substrate 602, mirror 606, first spacer layer 608, and/or second spacer layer 622 may be damaged and increasing a durability of the optical sensor device. In this case, frame 624 is separate from second spacer layer 622, thereby permitting frame 624 to be constructed from a different material from second spacer layer 622, with a different thickness relative to second spacer layer 622, or the like. In another example, second spacer layer 622 may be deposited in a different configuration, such as a configuration where second spacer layer 622 is not deposited adjacent to or connected to frame 624 or the like. For example, although edge 626 indicates that second spacer layer 622 is adjacent to or partially enclosed by frame 624, second spacer layer 622 may be spaced a particular distance from frame 624 such that second spacer layer 622 is not adjacent to or partially enclosed by frame 624 at edge 626 or another edge.

As indicated above, FIGS. 6A-6E are provided merely as an example. Other examples are possible and may differ from what was described with regard to FIGS. 6A-6E.

FIGS. 7A and 7B are diagrams of an example implementation 700 relating to the example process 200 shown in FIG.

2. FIGS. 7A and 7B show an example of another filter associated with a multispectral filter array.

As shown in FIG. 7A, an optical sensor device 702 may include a set of layers. Optical sensor device 702 may include a substrate 705 (e.g., which may include one or more optical sensors), a first zinc-oxide layer 710-1, a first silver mirror layer 715-1, a second zinc-oxide layer 710-2, a niobium-titanium-oxide layer 720, a third zinc-oxide layer 710-3, a second silver mirror layer 715-2, a fourth zinc-oxide layer 710-4, a first silicon-oxide layer 725-1, a niobium-titanium-oxide layer 730, and a second silicon-oxide layer 725-2. Zinc-oxide layers 710 are deposited to at least partially enclose silver mirror layers 715, thereby protecting silver mirror layers 715 from degradation, thereby improving durability of optical sensor device 702 relative to utilizing exposed mirror layers (e.g., one or more mirror layers deposited directly onto substrate 705 or niobium-titanium-oxide layer 720 or one or more silver mirror layers 715 directly onto which niobium-titanium-oxide layer 720 or first silicon-oxide layer 725-1 is deposited). Optical sensor device 702 may include a first region 740 (e.g., a multispectral filter array), which includes zinc-oxide layers 710, silver mirror layers 715, and niobium-titanium-oxide layer 720. Optical sensor device 702 may include a second region 745, which includes silicon-oxide layers 725 and niobium-titanium-oxide layer 730. Layers of second region 745 may be deposited onto portions of region 740 to provide a filtering functionality for optical sensor device 702. For example, second region 745 may provide an anti-reflective coating for optical sensors of optical sensor device 702.

As shown in FIG. 7B, a similar optical sensor device 702 includes a substrate 705, a similar region 740 (e.g., a similar multispectral filter array), and a set of silicon-oxide layers 750 (shown as 750-1 through 750-5) and a set of niobium-titanium-oxide layers 755 (shown as 755-1 through 755-4). In this case, a region 760, which includes the set of silicon-oxide layers 750 and the set of niobium-titanium-oxide layers 755 may provide higher order suppression of certain wavelengths (e.g., ultraviolet (UV)-green wavelengths). In this way, a filtering functionality may be added to a multispectral filter array by depositing one or more other layers onto the multispectral filter array.

As indicated above, FIGS. 7A and 7B are provided merely as an example. Other examples are possible and may differ from what was described with regard to FIGS. 7A and 7B.

Figure 8B:
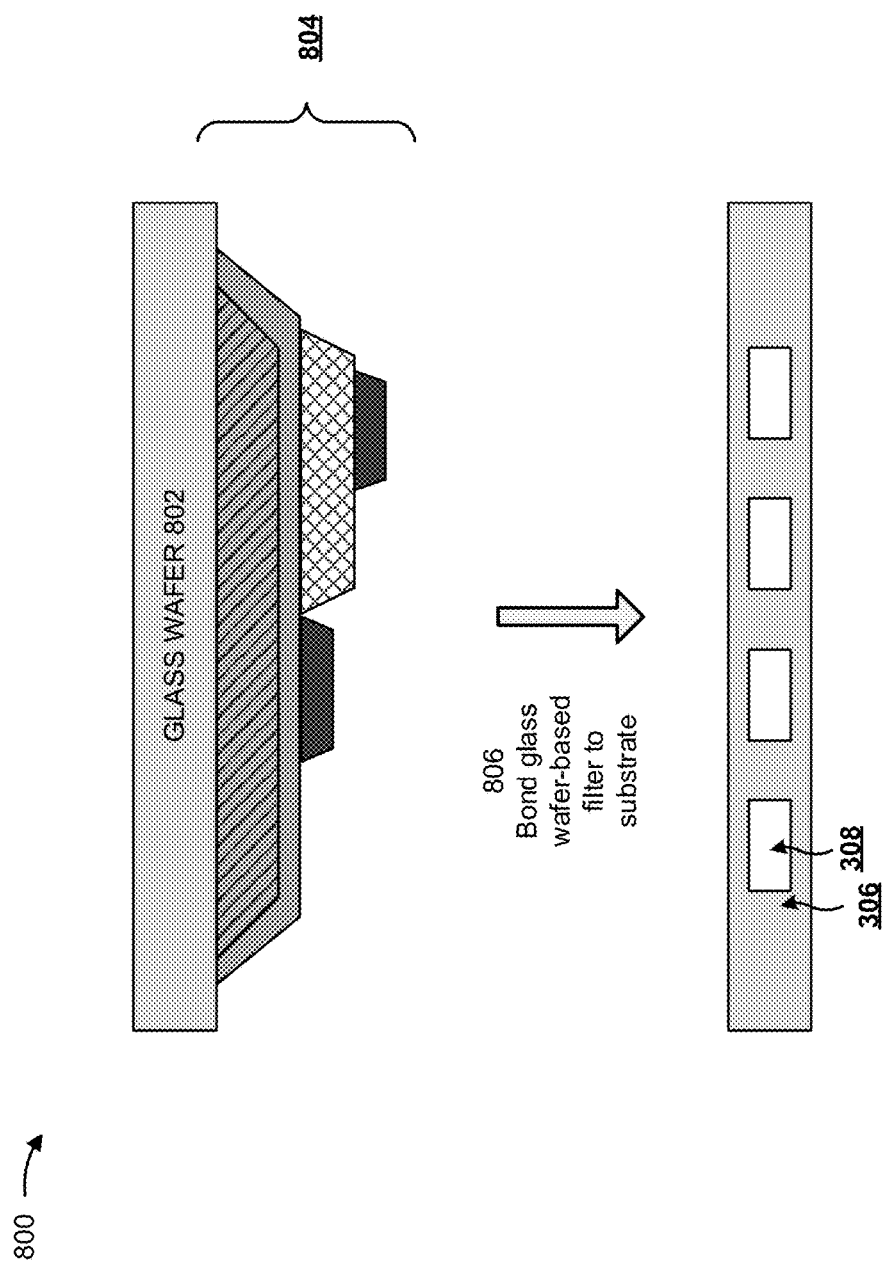

FIGS. 8A and 8B are diagrams of an example implementation 800 relating to example process 200 shown in FIG. 2.

As shown in FIG. 8A, sensor elements 308 may be disposed in substrate 306 during manufacture of an optical sensor device described herein. A glass wafer 802 may be provided, onto which a set of filter and spacer layers may be deposited, as described herein.

As shown in FIG. 8B, after depositing a set of layers 804 onto glass wafer 802, glass wafer 802 and layers 804 are bonded to substrate 306, as shown by reference number 806. In this way, layers can be formed on a separate substrate from sensor elements 308 and attached to sensor elements 308.

As indicated above, FIGS. 8A and 8B are provided merely as an example. Other examples are possible and may differ from what was described with regard to FIGS. 8A and 8B.

Figure 9:
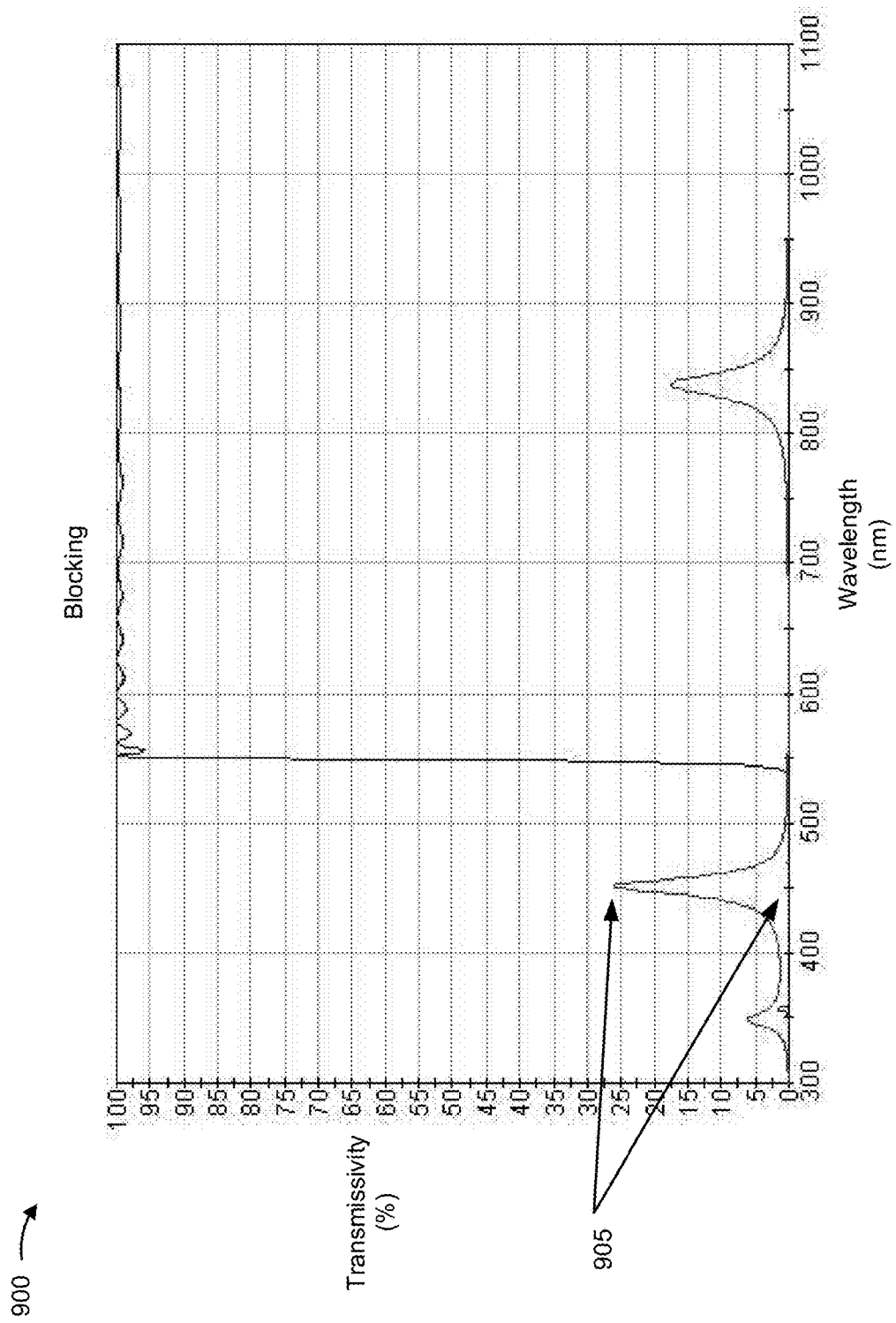
FIG. 9 is an example diagram relating to the example process shown in FIG. 2.

FIG. 9 is an example of a diagram 900 of a transmissivity (as a percentage of light) relative to wavelength (of the light in nm). FIG. 9 shows a spectral response of a filter stack, described herein with regard to FIG. 7B, for suppressing higher order peaks at lower wavelengths, as indicated by reference number 905. For example, when a large spectral bandwidth is to be covered, as shown, and a particular subset of the spectral bandwidth is to be passed, such as at 850 nm, a bandpass filter, as described with regard to FIG. 7B, may be provided to block higher order peaks at 350 nm and 450 nm and may exhibit spectral performance similar to diagram 900.

As indicated above, FIG. 9 is provided merely as an example. Other examples are possible and may differ from what was described with regard to FIG. 9.

Figure 10A:
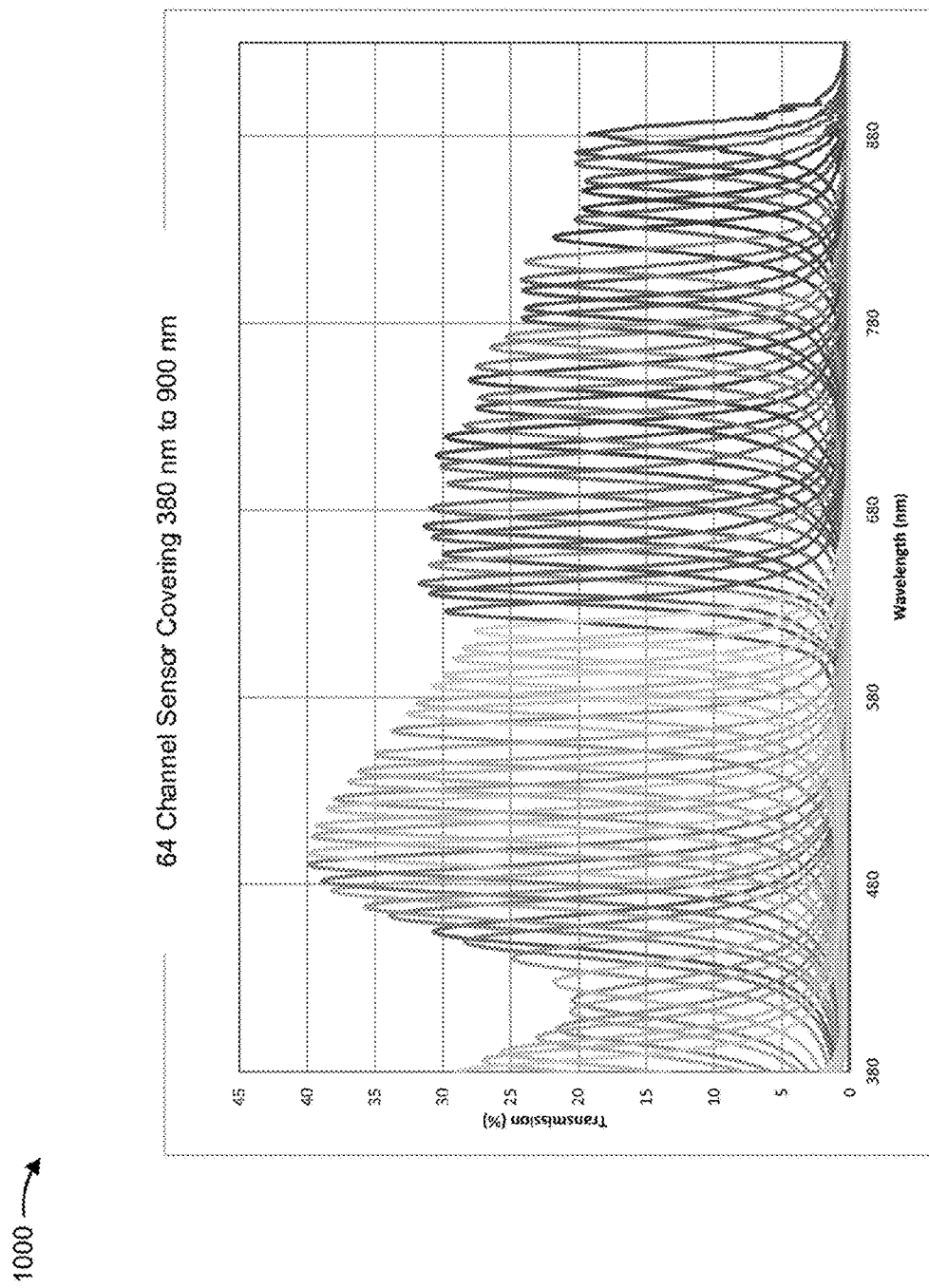
FIGS. 10A and 10B are example diagrams relating to the example process shown in FIG. 2.
Figure 10B:
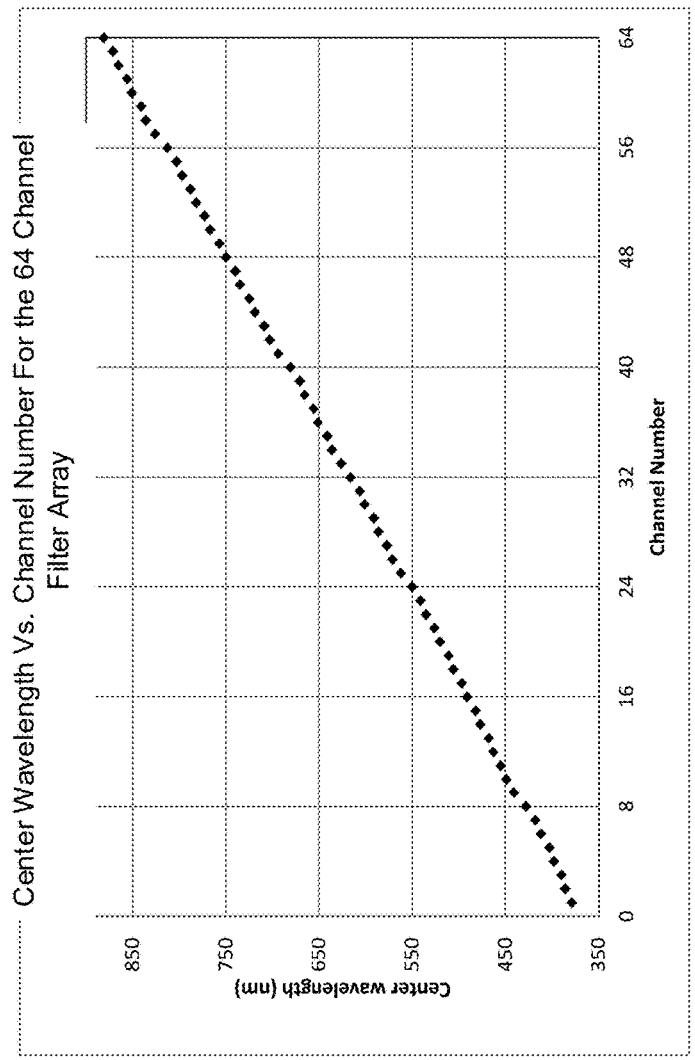

FIG. 10A are example diagrams 1000 and 1010 of a 64 channel filter array using a silver based mirror and a niobium-titanium-oxide based spacer, as described herein. FIG. 10A shows a spectral range of each sensor element of the 64 channel filter array based on a corresponding filter portion. FIG. 10B shows a center wavelength for each sensor element of the 64 channel filter array based on a corresponding filter portion. In this case, each sensor element is centered at a different wavelength. In another example, multiple sensor elements may be centered at a common wavelength.

As indicated above, FIG. 10 is provided merely as an example. Other examples are possible and may differ from what was described with regard to FIG. 10.

In this way, a multi spectral filter array may be fabricated for an optical sensor device that is integrated onto a semiconductor substrate of the optical sensor device, provides relatively low angle shift, relatively high spectral range, and is environmentally durable relative to other filter structures.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
   a multispectral filter array disposed on a substrate, the multispectral filter array including:
a first metal mirror disposed on the substrate,
a spacer disposed on the first metal mirror,
the spacer including a set of layers,
a second metal mirror disposed on the spacer; and
wherein the second metal mirror is aligned with two or more sensor elements of a set of sensor elements.

2. The device of claim 1, where the first metal mirror has a uniform thickness over the set of sensor elements.

3. The device of claim 1, where the second metal mirror is aligned with all of the set of sensor elements.

4. The device of claim 1, where the set of layers comprises:
a set of spacer layers,
a first layer of the set of spacer layers corresponding to a first channel, of a set of optical channels aligned to the set of sensor elements, and being associated with a first thickness, and
a second layer of the set of spacer layers corresponding to a second channel, of the set of optical channels, and being associated with a second thickness that is different than the first thickness,
the first layer covering a first quantity of sensor elements of the set of sensor elements,
the second layer covering a second quantity of sensor elements of the set of sensor elements,
the second quantity being half the first quantity.

5. The device of claim 1, where the first metal mirror and the second metal mirror include at least one of:
a silver (Ag)-based mirror,
an aluminum (Al)-based mirror, or
a copper (Cu)-based mirror.

6. The device of claim 1, where the spacer includes at least one of:
an amorphous silicon-based material,
a hydrogenated amorphous silicon (Si:H)-based material,
a germanium (Ge)-based material,
a niobium-oxide ($Nb_2O_5$)-based material,
a titanium-oxide ($TiO_2$)-based material,
a tantalum-oxide ($Ta_2O_5$)-based material,
a silicon-oxide ($SiO_2$)-based material,
an yttrium-oxide ($Y_2O_3$)-based material,
a zirconium-oxide ($ZrO_2$)-based material,
an aluminum-oxide ($Al_2O_3$)-based material,
a silicon-nitride ($Si_3N_4$)-based material.

7. The device of claim 1, where one or more layers of the multispectral filter array are deposited layers, the deposited layers being deposited on the substrate using a pulsed magnetron sputtering process.

8. The device of claim 1, where the set of sensor elements further comprise at least one of:
a photodiode array,
a charge-coupled device (CCD), or
a complementary metal-oxide-semiconductor (CMOS).

9. The device of claim 1, where the multispectral filter array further includes:
a first set of zinc (Zn) oxide protective layers sandwiching the first metal mirror; and
a second set of zinc (Zn) oxide protective layers sandwiching the second metal mirror.

10. The device of claim 1, further comprising:
one or more filter layers disposed on the multispectral filter array to filter light directed to the set of sensor elements,
the one or more filter layers including at least one of:
an out-of-band blocking set of layers,
an anti-reflective coating set of layers, or
a higher order suppression set of layers.

11. The device of claim 1, further comprising:
a set of lenses disposed on the multispectral filter array,
a particular lens, of the set of lenses, being associated with directing light toward a particular optical sensor, of the set of sensor elements, via a channel of the multispectral filter array.

12. An optical filter, comprising:
a first layer,
the first layer being a first mirror to reflect a portion of light directed toward the first layer,
the first layer being deposited on a substrate associated with a set of sensor elements;
a second set of layers,
the second set of layers being deposited solely on the first layer,
the second set of layers being associated with a set of channels corresponding to the set of sensor elements,
a channel, of the set of channels, being associated with a particular thickness corresponding to a particular wavelength of light that is to be directed toward a particular sensor element of the set of sensor elements; and
a third layer,
the third layer being a second metal mirror to reflect a portion of light directed toward the third layer,
the third layer being deposited on a plurality of the set of sensor elements associated with the second set of layers.

13. The optical filter of claim 12, where a spectral range of light that is directed toward the set of sensor elements when the optical filter is exposed to a light source is between approximately 380 nanometers and approximately 1100 nanometers.

14. The optical filter of claim 12, where the first layer having been deposited on the substrate via a pulsed magnetron sputtering process.

15. The optical filter of claim 12, where at least one of the first layer or the third layer includes a first oxide-based protective layer, a metal-based reflector layer, and a second oxide-based protective layer,
the metal-based reflector layer being sandwiched between the first oxide-based protective layer and the second oxide-based protective layer.

16. The device of claim 1, where the set of sensor elements are embedded into the substrate.

17. The device of claim 1, where the set of sensor elements are a plurality of optical sensors of a sensor array.

18. The device of claim 1, where the set of sensor elements are associated with receiving a portion of light from a light source.

19. The device of claim 1, where the set of sensor elements is a back illuminated sensor array.

20. The device of claim 1, where the set of layers comprise a material selected to reduce an angle shift of light directed from a light source toward the set of sensor elements.

* * * * *